United States Patent
Wuister et al.

(10) Patent No.: US 10,884,333 B2
(45) Date of Patent: Jan. 5, 2021

(54) METHOD OF DESIGNING LITHOGRAPHY FEATURES BY SELF-ASSEMBLY OF BLOCK COPOLYMER

(71) Applicant: ASML Netherlands B.V., Veldhoven (NL)

(72) Inventors: Sander Frederik Wuister, Eindhoven (NL); Bart Laenens, Milpitas, CA (US); Davide Ambesi, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 942 days.

(21) Appl. No.: 14/909,057

(22) PCT Filed: Jul. 9, 2014

(86) PCT No.: PCT/EP2014/064728
§ 371 (c)(1),
(2) Date: Jan. 29, 2016

(87) PCT Pub. No.: WO2015/018590
PCT Pub. Date: Feb. 12, 2015

(65) Prior Publication Data
US 2016/0178999 A1    Jun. 23, 2016

Related U.S. Application Data

(60) Provisional application No. 61/874,875, filed on Sep. 6, 2013, provisional application No. 61/862,853, filed on Aug. 6, 2013.

(51) Int. Cl.
G03F 1/70    (2012.01)
G03F 7/00    (2006.01)
(Continued)

(52) U.S. Cl.
CPC ............ G03F 1/70 (2013.01); B81C 1/00031 (2013.01); G03F 7/0002 (2013.01);
(Continued)

(58) Field of Classification Search
CPC ........ G03F 1/70; G03F 7/0002; G06F 30/392; G06F 30/398; B81C 1/00031; B81C 2201/0149
See application file for complete search history.

(56) References Cited

U.S. PATENT DOCUMENTS

| 2003/0118800 A1* | 6/2003 | Thomas | C08L 53/00 |
| | | | 428/215 |
| 2007/0224819 A1 | 9/2007 | Sandhu | |

(Continued)

FOREIGN PATENT DOCUMENTS

| JP | 2005-032058 | 2/2005 |
| TW | 200844038 | 11/2008 |
| TW | 201319148 | 5/2013 |

OTHER PUBLICATIONS

Kim et al., "Epitaxial self-assembly of block copolymers on lithographically defined nanopatterned substrates". Nature vol. 424, pp. 411-414 (Jul. 24, 2003).*

(Continued)

*Primary Examiner* — Jack Chiang
*Assistant Examiner* — Aric Lin
(74) *Attorney, Agent, or Firm* — Pillsbury Winthrop Shaw Pittman, LLP

(57) ABSTRACT

A method of design or verification for a self-assemblable block copolymer feature, the block copolymer feature including a first domain having a first polymer type and a second domain having a second polymer type, the method including, based on the length of the second polymer type or on an uncertainty in position of the first domain within the (Continued)

block copolymer feature calculated based on the length of the second polymer type, adjusting a parameter of the self-assembly process of a block copolymer feature or verifying a placement of a block copolymer feature.

20 Claims, 12 Drawing Sheets

(51) Int. Cl.
    *B81C 1/00*     (2006.01)
    *G06F 30/392*     (2020.01)
    *G06F 30/398*     (2020.01)

(52) U.S. Cl.
    CPC .......... *G06F 30/392* (2020.01); *G06F 30/398* (2020.01); *B81C 2201/0149* (2013.01)

(56) References Cited

U.S. PATENT DOCUMENTS

| | | | |
|---|---|---|---|
| 2008/0176767 A1* | 7/2008 | Millward | B81C 1/00031 506/20 |
| 2008/0311347 A1 | 12/2008 | Millward et al. | |
| 2011/0209106 A1 | 8/2011 | Cheng et al. | |
| 2012/0076978 A1 | 3/2012 | Millward et al. | |
| 2012/0331428 A1 | 12/2012 | Cheng et al. | |
| 2013/0189492 A1 | 7/2013 | Millward et al. | |

OTHER PUBLICATIONS

Stoykovich et al., "Directed Self-Assembly of Block Copolymers for Nanolithography: Fabrication of Isolated Features and Essential Integrated Circuit Geometries". ACS Nano 2007 1 (3), 168-175 (Oct. 6, 2007).*

International Search Report and Written Opinion dated Oct. 6, 2014 in corresponding International Patent Application No. PCT/EP2014/064728.

Miri Park et al., "Block Copolymer Lithography: Periodic Arrays of ~$10^{11}$ Holes in 1 Square Centimeter," Science, vol. 276, pp. 1401-1404 (May 30, 1997).

Ion Bita et al., "Graphoepitaxy of Self-Assembled Block Copolymers on Two-Dimensional Periodic Patterned Templates," Science, vol. 321, pp. 939-943 (Aug. 15, 2008).

* cited by examiner

METHOD OF DESIGNING LITHOGRAPHY FEATURES BY SELF-ASSEMBLY OF BLOCK COPOLYMER

CROSS-REFERENCE TO RELATED APPLICATIONS

This application is the U.S. national phase entry of PCT patent application no. PCT/EP2014/064728, which was filed on Jul. 9, 2014, which claims the benefit of priority of U.S. Provisional Patent Application No. 61/862,853, filed Aug. 6, 2013 and U.S. Provisional Application No. 61/874,875 filed Sep. 6, 2013, each of which is incorporated by reference herein in its entirety.

FIELD

The present invention relates to a method of designing formation of lithography features by self-assembly of block copolymer and of determining an uncertainty in the position of a feature formed using block copolymer.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In projection photolithography, the push for smaller features has resulted in the development of technologies such as immersion lithography and extreme ultraviolet (EUV) lithography.

As an alternative, so-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both projection photolithography and for imprint lithography, it is desirable to provide high resolution patterning of surfaces, for example of an imprint template or of other substrates. The use of self-assembly of a block copolymer (BCP) has been considered as a potential method for increasing the feature resolution to a smaller dimension than that obtainable by prior lithography methods or as an alternative to electron beam lithography for preparation of imprint templates.

A self-assemblable BCP is a compound useful in nanofabrication because it may undergo an order-disorder transition on cooling below a certain temperature (order-disorder transition temperature To/d) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have a line width roughness of the order of about 1-5 nm and may be manipulated by modification of the chemical compositions of the blocks of the copolymer.

The feasibility of using a thin film of BCP as a self-assembling template was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A BCP comprises different blocks, each typically comprising one or more identical monomers, and arranged side-by side along the polymer chain. Each block may contain many monomers of its respective type. So, for instance, an A-B BCP may have a plurality of type A monomers in the (or each) A block and a plurality of type B monomers in the (or each) B block. An example of a suitable BCP is, for instance, a polymer having covalently linked blocks of polystyrene (PS) monomer (hydrophobic block) and polymethylmethacrylate (PMMA) monomer (hydrophilic block). Other BCPs with blocks of differing hydrophobicity/hydrophilicity may be useful. For instance a triblock copolymer such as (A-B-C) BCP may be useful, as may an alternating or periodic BCP e.g. [-A-B-A-B-A-B-]$_n$ or [-A-B-C-A-B-C]$_m$ where n and m are integers. The blocks may be connected to each other by covalent links in a linear or branched fashion (e.g., a star or branched configuration).

A BCP may form many different phases upon self-assembly, dependent upon the volume fractions of the blocks, degree of polymerization within each block type (i.e. number of monomers of each respective type within each respective block), and the optional use of a solvent and surface interactions. When applied in a thin film, geometric confinement may pose additional boundary conditions that may limit the phases formed. In general, spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled BCPs.

The phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At a 50:50 ratio, a lamellar phase is formed. With a ratio of 30:70 an inverted cylindrical phase may be formed and at a ratio of 20:80, an inverted cubic phase may be formed.

Suitable BCPs for use as a self-as semblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly (styrene-b-ethyleneoxide), poly(ethyleneoxide-b-isoprene). The symbol "b" signifies "block". Although these are diblock copolymer examples, it will be apparent that self-assembly may also employ a tri-block, tetra-block or other multi-block copolymer.

One method used to guide or direct self-assembly of a polymer (such as a BCP) onto a substrate surface is known as graphoepitaxy. This method involves the self-organization of a BCP guided by topological pre-patterning on the substrate using one or more features constructed of resist (or one or more features transferred from resist onto a substrate surface, or one or more features transferred onto a film stack deposited on the substrate surface). The pre-patterning is used to form an enclosure or "recess" comprising a substrate base and a sidewall, e.g., a pair of opposing side-walls, of resist (or a side-wall formed in a film or a side-wall formed in the substrate).

Typically, the height of a feature of a graphoepitaxy template is of the order of the thickness of the BCP layer to be ordered, so may be, for instance, from about 20 nm to about 150 nm.

A lamellar self-assembled BCP can form a parallel linear pattern of lithography features with adjacent lines of the different polymer block domains in the recesses. For instance if the BCP is a di-block copolymer with A and B blocks within the polymer chain, the BCP may self-assemble into an ordered layer in each recess, the layer comprising regularly spaced first domains of A blocks, alternating with second domains of B blocks.

Similarly, a cylindrical self-assembled BCP can form an ordered pattern of lithography features comprising cylindrical discontinuous first domains surrounded by a second continuous domain. For instance, if the BCP is a di-block copolymer with A and B blocks within the polymer chain, the A block may assemble into a cylindrical discontinuous domain within a circular recess and surrounded by a continuous domain of B block. Alternatively, the A block may assemble into cylindrical discontinuous domains regularly spaced across a linear recess and surrounded by a continuous domain of B block.

Graphoepitaxy may be used, therefore, to guide the self-organization of lamellar or cylindrical phases such that the BCP pattern subdivides the spacing of the side wall(s) of a recess into domains of discrete copolymer patterns.

In a process to implement the use of BCP self-assembly in nanofabrication, a substrate may be modified with a neutral orientation control layer, as part of the graphoepitaxy template, to induce the preferred orientation of the self-assembly pattern in relation to the substrate. For some BCPs used in self-assemblable polymer layers, there may be a preferential interaction between one of the blocks and the substrate surface that may result in orientation. For instance, for a polystyrene(PS)-b-PMMA BCP, the PMMA block will preferentially wet (i.e. have a high chemical affinity with) an oxide surface and this may be used to induce the self-assembled pattern to lie oriented substantially parallel to the plane of the surface. Substantially normal orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "normal orientation" it is meant that the domains of each block will be positioned side-by-side at the substrate surface, with the interfacial regions between adjacent domains of different blocks lying substantially perpendicular to the plane of the surface.

In a graphoepitaxy template for aligning a di-block copolymer having A and B blocks, where A is hydrophilic and B is hydrophobic in nature, the graphoepitaxy pattern may comprise hydrophobic side-wall features, with a neutral orientation base between the hydrophobic features. The B domain may preferentially assemble alongside the hydrophobic features, with several alternating domains of A and B blocks aligned over the neutral orientation region between the pinning features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to about 40 nm, or less than or equal to about 20 nm.

A thin layer of self-assemblable BCP may be deposited onto a substrate having a graphoepitaxy template as set out above. A suitable method for deposition of the self-assemblable polymer is spin-coating, as this process is capable of providing a well-defined, uniform, thin layer of self-assemblable polymer. A suitable layer thickness for a deposited self-assemblable polymer film is approximately 10 nm to 150 nm.

Following deposition of the BCP film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a BCP is a process where the assembly of many small components (the BCP) results in the formation of a larger more complex structure (the nanometer sized features in the self-assembled pattern). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B BCP, with the driving force for phase separation described by Flory-Huggins theory for the system under consideration. The use of graphoepitaxy may greatly reduce defect formation. The Flory-Huggins interaction parameter (chi value), and the degree of polymerization of the BCP blocks (N value) are parameters of the BCP which affect the phase separation, and the dimensions with which self-assembly of a particular BCP occurs.

For a polymer which undergoes self-assembly, the self-assemblable polymer will exhibit an order-disorder temperature To/d. To/d may be measured by any suitable technique for assessing the ordered/disordered state of the polymer, such as differential scanning calorimetry (DSC). If layer formation takes place below this temperature, the molecules will be driven to self-assemble. Above the temperature To/d, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature Tg below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature To/d for the polymer.

Ordering and defect annihilation may be combined into a single annealing process or a plurality of processes may be used in order to provide a layer of self-assembled polymer such as BCP, having an ordered pattern of domains of differing chemical type (of domains of different block types).

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the features of the second domain type. A pattern having parallel cylindrical phase domains can be etched using a dry etching or reactive ion etching technique. A pattern having lamellar phase domains can utilize a wet etching technique in addition to or as an alternative to those suitable for the etching of parallel cylindrical phase domains.

Following the breakthrough etching, the pattern may be transferred by so-called transfer etching using an etching means which is resisted by the second domain type and so forms recesses in the substrate surface where the surface has been laid bare.

SUMMARY

It has been discovered that there may be uncertainty in the position of a domain within a self-assembled block copolymer feature.

According to an embodiment, the uncertainty may be determined. According to an embodiment, the uncertainty or an associated parameter may be used in the design, and/or manufacture, of a patterned substrate, component or device. In particular, an indication of the uncertainty or its associated parameter allows for more confidence in the placement of a feature on a substrate.

According to an embodiment, there is provided a method of design for a self-assemblable block copolymer feature, the block copolymer feature comprising a first domain comprising a first polymer type and a second domain comprising a second polymer type, the method comprising: based on the length of the second polymer type or on an uncertainty in position of the first domain within the block copolymer feature calculated based on the length of the second polymer type, adjusting a design of a template to guide the self-assembly of the block copolymer of the block copolymer feature or adjusting a physical parameter of the block copolymer.

According to an embodiment, there is provided a method of design or verification for a self-assemblable block copolymer feature, the block copolymer feature comprising a first domain comprising a first polymer type and a second domain comprising a second polymer type, the method comprising: calculating an uncertainty in the position of the first domain within the block copolymer feature based on the length of the second polymer type or an uncertainty in the position of the first domain within the block copolymer feature calculated based on the length of the second polymer type; and based on the uncertainty, adjusting a parameter of the self-assembly process of a block copolymer feature or verifying a placement of a block copolymer feature.

According to an embodiment, there is provided a method of design for a plurality of adjacent self-assemblable block copolymer features at respective portions of a template to guide the self-assembly of the block copolymer of the block copolymer features, the block copolymer features respectively comprising a first domain comprising a first polymer type and a second domain comprising a second polymer type, the method comprising: based on an offset between a designed self-assembly location of one of the template portions and the position of the first domain within the self-assembled block copolymer feature at that designed self-assembly location or on an uncertainty in the position of the first domain within the block copolymer feature calculated based on the offset, adjusting a design of the template or adjusting a physical parameter of the block copolymer.

According to an embodiment, there is provided a method of design or verification for a plurality of adjacent self-assemblable block copolymer features at respective portions of a template to guide the self-assembly of the block copolymer of the block copolymer features, the block copolymer features respectively comprising a first domain comprising a first polymer type and a second domain comprising a second polymer type, the method comprising: calculating an uncertainty in the position of the first domain within one of the block copolymer features based on an offset between a designed self-assembly location of one of the template portions and the position of the first domain within the self-assembled block copolymer feature at that designed self-assembly location; and based on the uncertainty, adjusting a parameter of the self-assembly process of a block copolymer feature or verifying a placement of a block copolymer feature.

According to an embodiment, there is provided a method of design or verification for a patterning process comprising self-assembly of a block copolymer feature, the block copolymer feature comprising a first domain comprising a first polymer type and a second domain comprising a second polymer type, the method comprising adjusting a parameter of the process based on the length of the second polymer type.

According to an embodiment, there is provided a computer program comprising computer readable instructions configured to cause a computer to carry out a method as described herein.

According to an aspect, there is provided a computer readable medium carrying a computer program as described herein.

According to an aspect, there is provided an apparatus comprising a memory storing processor readable instructions, and a processor arranged to read and execute instructions stored in the memory, wherein the processor readable instructions comprise instructions arranged to control the computer to carry out a method as described herein.

One or more aspects of the invention may, where appropriate to one skilled in the art, be combined with any one or more other aspects described herein, and/or with any one or more features described herein.

BRIEF DESCRIPTION OF THE DRAWINGS

Specific embodiments of the invention will be described with reference to the accompanying Figures, in which.

DETAILED DESCRIPTION

Figure 1A:
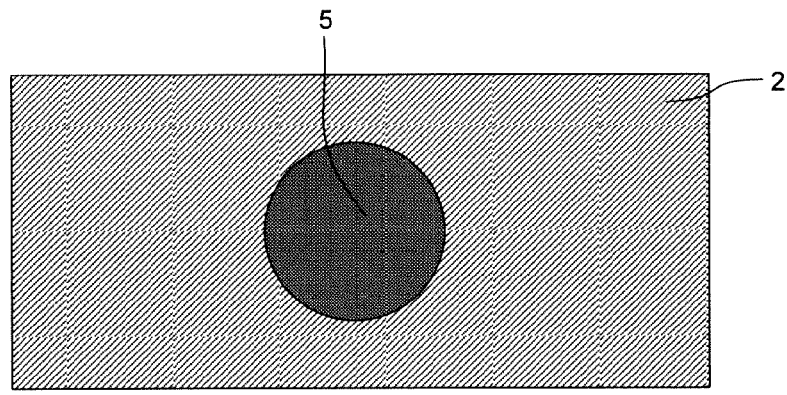
FIGS. 1A-1E schematically depict directed self-assembly of A-B block copolymer onto a substrate by graphoepitaxy.
Figure 1B:
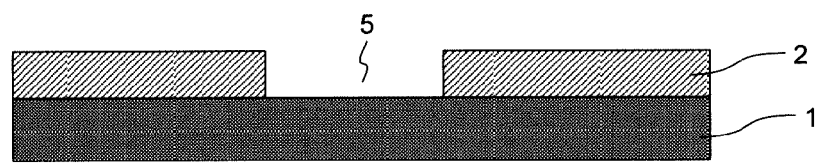

FIGS. 1A and 1B show, in plan view and cross-section respectively, part of a substrate 1 to which a lithography process using self-assembly of BCP is applied. An anti-reflection coating may be present on the surface of the substrate 1. The anti-reflection coating (if present) may be an organic material, such as, for example, ARC 29, from Brewer Science Inc. of Rolla, Mo. The anti-reflection coating may be an inorganic material such as, for example, SiC or SiON. A neutral layer may be provided on the anti-reflection coating. A layer of resist 2 is applied to the substrate 1. The layer of resist 2 may, for example, be a photo-resist. In an embodiment, the resist is a negative tone developed resist (resist developed by an organic developer). This type of resist is typically compatible with the organic solvent used in the spin coating of the block copolymer. The layer of resist 2 is patterned to form a contact hole (via) recess 5 for use in the self-assembly of the block copolymer. The recess 5 may be formed by photolithography, imprint lithography or another lithographic process. For the purposes of the self-assembly, the recess 5 need not be in the resist. For example, the recess 5 may be formed in a lower layer by, e.g., etching through an opening in the resist 2 (such as shown in FIGS. 1A and 1B). Hereafter, for convenience, the recess 5 is described and depicted as being in the resist 2 although it need not be.

Figure 1C:
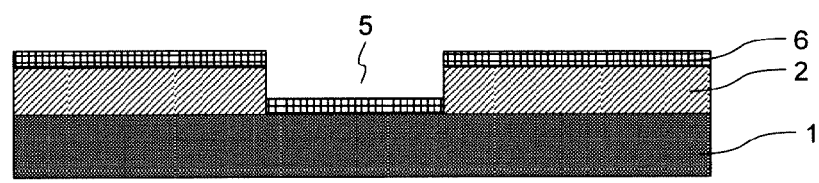
Figure 1D:
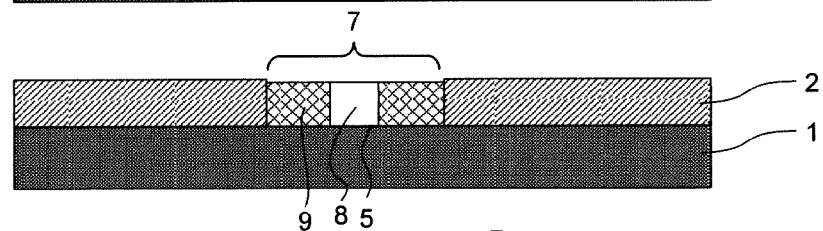
Figure 1E:
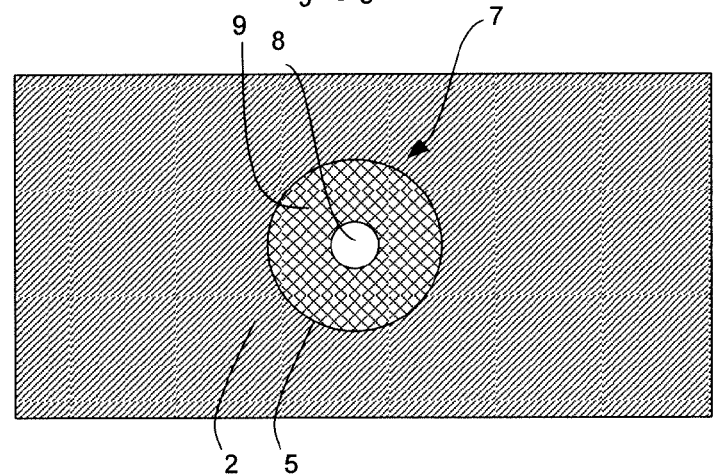

In FIG. 1C, a BCP layer 6 has been deposited onto the substrate 1 and the resist 2. The BCP layer 6 is shown with a uniform thickness within the recess 5, and on top of the resist 2. In FIGS. 1D and 1E, which show cross-section and plan views respectively, the BCP layer 6 has been thermally annealed (thereby causing self-assembly of the BCP material to occur). The thermal annealing process causes a redistribution of the BCP material, with the BCP material being transported from a region above resist 2 into the recess 5. For simplicity all of the BCP material has been depicted as being transported into the recess 5. However, in practice, some BCP material may remain in the region above the resist 2. Solvent annealing may be used instead of thermal annealing (a solvent swells a block copolymer thereby increasing its mobility such that rearrangement of the block copolymer is possible).

The use of a BCP material allows domains of component polymer material to be self-assembled within a BCP feature. For example, the BCP deposited within the recess 5 can be seen to have formed distinct domains of polymer. A type A polymer domain 8 is formed as, for example, a cylinder and is surrounded by a continuous type B polymer domain 9. The type A polymer domain 8 and the type B polymer domain 9 form a BCP feature 7 within the recess 5. In an embodiment, the type B polymer domain 9 is formed as, for example, a cylinder and is surrounded by a continuous type A polymer domain 8.

As noted above, a neutral orientation layer may be provided on the substrate. The neutral orientation layer may have a similar chemical affinity for the type A polymer block and the type B polymer block, such that both blocks wet the neutral orientation layer in a similar manner. This may promote domains of type A and B polymers to form which have a normal orientation (i.e. substantially perpendicular to the surface of the substrate). The neutral orientation layer may have a surface energy which is greater than a surface energy of one of the two polymer domains 8 and 9 and less than a surface energy of the other of the two polymer domains 8 and 9.

To guide the self-assembly, a lateral dimension is controlled by, for example, the spacing of one or more walls. The width (e.g., diameter) of the recess 5 may, for example, be approximately 70 nanometers. The width of the recess 5 may, for example, be in the range of between approximately 20 nanometers and approximately 100 nanometers. The width (e.g., diameter) of the type A polymer domain 8 inside the recess 5 may, for example, be approximately 30 nanometers. The width (e.g., diameter) of the type A polymer domain 8 inside the recess 5 may, for example, be in the range of between approximately 5 nanometers and approximately 50 nanometers.

The BCP material thickness also influences the self-assembly process. The thickness of the BCP layer within the recess 5 may be optimized for the formation of distinct domains of type A and type B polymer.

Figure 2:
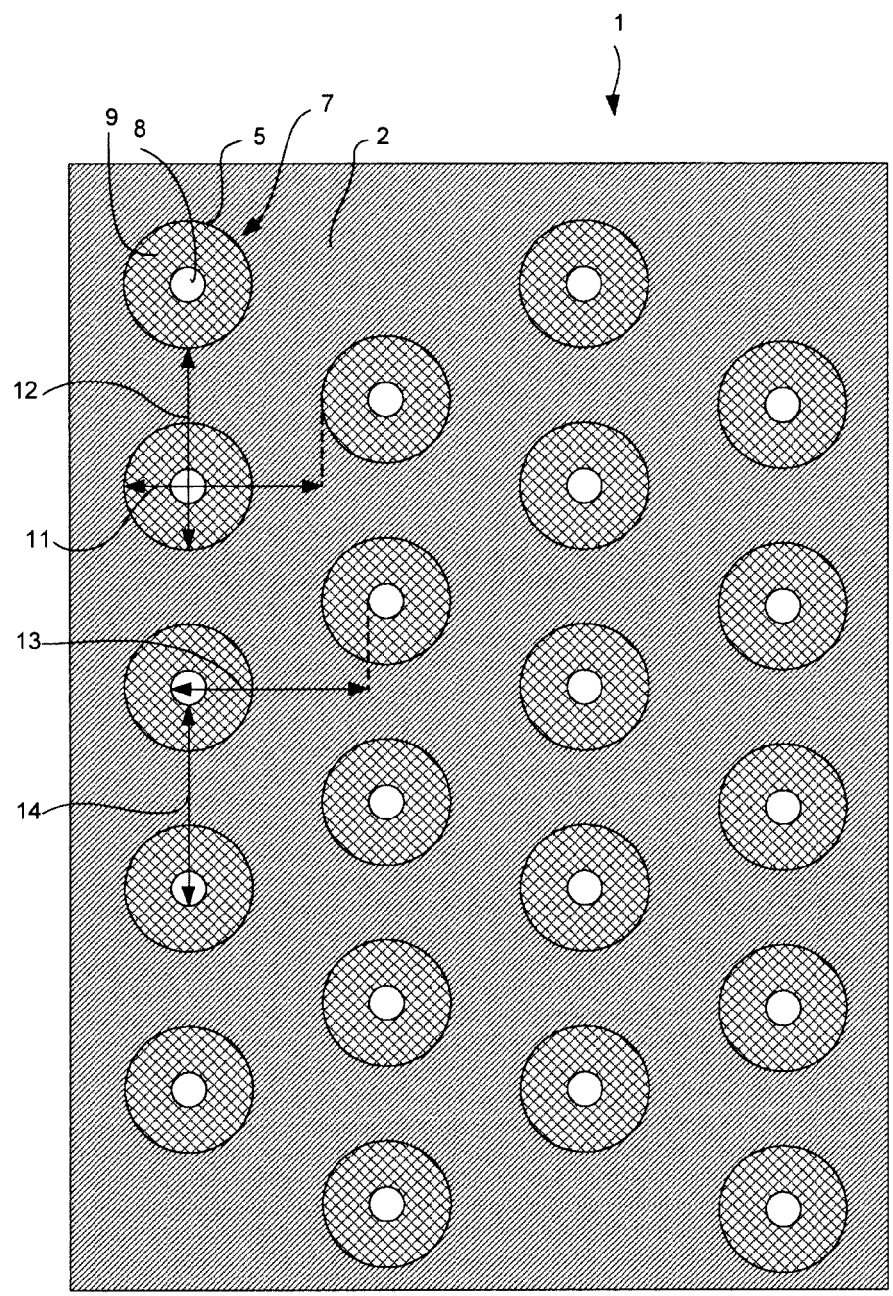
FIG. 2 schematically depicts a plurality of A-B block copolymer features on a substrate.

A plurality of BCP features 7 may be formed on a single substrate 1. For example, a formation of a plurality of cylindrical BCP features (such as the cylindrical BCP feature 7 depicted in FIG. 1), may be formed on a substrate 1. FIG. 2 schematically depicts in plan view a larger part of the substrate 1 to which a lithography process using self-assembly of BCP has been applied. A layer of resist 2 is applied to the substrate 1. The layer of resist 2 is patterned with a plurality of recesses 5. A BCP layer is deposited onto the substrate 1 and a thermal annealing process applied to the BCP layer. A respective BCP feature 7 is formed within each of the recesses 5. The BCP features 7 each comprise a type A polymer domain 8 and a type B polymer domain 9. The type A polymer domain 8 is formed as, for example, a cylinder and is surrounded by the continuous type B polymer domain 9. The type A polymer domain 8 may, for example, comprise blocks of polymethylmethacrylate (PMMA) monomer. The type B polymer domain 9 may, for example, comprise blocks of polystyrene (PS) monomer. Suitable block copolymers for use as self-assemblable polymers include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene), poly(styrene-b dimethylsiloxane), poly(styrene-b-lactic acid), poly(dimethylsiloxane-b-lactic acid). The symbol "b" signifies "block". Although these foregoing block copolymers are di-block copolymers, self-assembly may also employ tri-block, tetrablock or other multi-block copolymers.

The BCP feature 7 may further comprise a second type A polymer domain (e.g. blocks of PMMA monomer) positioned around the periphery of the type B polymer domain 9. The second type A polymer domain may, for example, be in contact with the wall(s) of the recess 5. For simplicity the second type A polymer domain is not depicted in the Figures, however it will be appreciated that one or more additional polymer domains other than those depicted may be present in any given BCP feature 7.

The BCP features 7 are positioned at substantially regular intervals in both an x and a y direction. The separation and size of the BCP features 7 determine a pitch between BCP features 7. The pitch is defined as the width of one repeat unit of a BCP feature 7 (i.e. feature width plus inter-feature spacing). An x-pitch 11 and a y-pitch 12 between BCP features 7 are depicted in FIG. 2. An x-pitch 13 and a y-pitch 14 between type A polymer domains 8 are also depicted. The position and pitch of the type A polymer domains are a function of the position and pitch of the recesses 5 and of the position of the type A polymer domains within the BCP features 7.

The accuracy with which a type A polymer domain is positioned on the substrate is a significant factor in the manufacturing of a device using self-assembly block copolymer. For example a device may be manufactured by patterning a first plurality of features onto the substrate 1. The first plurality of features may, for example, correspond with the type A polymer domains 8 depicted in FIG. 2. This may be achieved, for example, by exposing the resist 2, the type A polymer domains 8 and the type B polymer domains 9 to an etching process. The etching process may remove the type A polymer domains 8. The etching process therefore exposes regions of the substrate 1 below the type A polymer domains 8. The resist 2 and the type B polymer domains 9 may be resistant to the etching process and may remain in place. A further etch process may be performed to etch the exposed regions of the substrate, thereby patterning features into the substrate which correspond with the type A polymer domains 8. These features may for example form contact holes of an integrated circuit.

The resist 2 and the type B polymer domains 9 may subsequently be removed from the substrate and a new layer of resist 2 may be deposited onto the substrate 1. A second plurality of features may then be patterned onto the substrate 1 by forming a second plurality of recesses 5 in the new layer of resist 2. A BCP layer 6 may then be deposited onto the substrate 1 and exposed to an annealing process, thereby forming a second plurality of BCP features 7 comprising a second plurality of type A polymer domains 8. One or more etching processes may then be performed to pattern a second plurality of features onto the substrate 1. The second plurality of features correspond to the second plurality of type A polymer domains 8.

When manufacturing a device using BCP, it is desirable, for example, that a feature of a plurality of features is accurately aligned relative to another of the plurality of features. Additionally or alternatively, it is desirable, for example, that the first plurality of features is accurately aligned relative to the second plurality of features.

The accuracy of the alignment of a feature of a plurality of features relative to another of the plurality of features and/or of one or more features of a first plurality of features relative to one or more features of a second plurality of features is dependent on uncertainty associated with the positioning of a type A polymer domain 8 on the substrate 1. This uncertainty may limit the minimum feature size and pitch separation achievable when manufacturing a device. For example, a decrease in the uncertainty associated with the positioning of a type A polymer domain 8 on the substrate 1 may allow smaller features to be patterned onto the substrate 1.

Thus, knowledge of the uncertainty may allow features to be patterned onto a substrate with a smaller feature pitch separation. It is therefore desirable for the design and manufacture of a device using BCP to employ knowledge of the uncertainty associated with positioning of a type A polymer domain.

In general, a device may be manufactured using other methods and features than those described above. For example a BCP feature having another shape and/or configuration than the uniformly arranged cylindrical shapes depicted in FIGS. 1 and 2 may be patterned onto a substrate. Indeed, while this description considers the example of contact hole formation (e.g., contact hole shrink where a contact hole shape printed with a lithography technique is filled with block copolymer to form the smaller contact hole), the application of the embodiments discussed herein are not limited to contact hole formation.

The uncertainty $\sigma_A$ associated with the positioning of a type A polymer domain 8 on the substrate 1 is a combination of the uncertainty $\sigma_{lith}$ associated with the positioning of one or more of the recesses 5 and the uncertainty $\sigma_{DSA}$ associated with the positioning of the one or more type A polymer domains 8 within a BCP feature 7. The uncertainty $\sigma_{lith}$ in the positioning of the recess 5 is due to uncertainty in the lithographic process used to form the recess 5. The uncertainty $\sigma_{DSA}$ in the positioning of a type A polymer domain 8 within a BCP feature 7 is due to uncertainty and process variations in the directed self-assembly process. The combined uncertainty $\sigma_A$ is given by equation (1):

$$\sigma_A = \sqrt{\sigma^2_{DSA} + \sigma^2_{lith}} \qquad (1)$$

In lithographic applications the value $3\sigma_A$ may be used in the design of a device manufactured using self-assembly block copolymer (it may be assumed that almost all features will fall within $3\sigma_A$ of their desired position). The uncertainty $\sigma_{lith}$ may be well known for the lithographic process which is employed to form the recess 5. However, the uncertainty $\sigma_{DSA}$ may be dependent on a number of different variables. For example, the uncertainty $\sigma_{DSA}$ may depend on the size and shape of a recess 5, the type A polymer used, the type B polymer used and the ratio of the quantity of type A polymer to type B polymer in the BCP material. The uncertainty $\sigma_{DSA}$ may, for example, be approximately 2 nanometers. The position of a type A polymer domain 8 in a round contact hole shaped recess 5 may distribute around the center of the recess 5 with a Gaussian profile.

The uncertainty $\sigma_{DSA}$ may be determined through experimentation. For example a plurality of BCP features 7 may be formed on a substrate 1. The position of the type A polymer domains within the plurality of BCP features 7 may then be measured for each of the plurality of BCP features 7. The measured positions may be used to calculate $\sigma_{DSA}$ using known statistical methods.

Additionally or alternatively, the uncertainty $\sigma_{DSA}$ may be computed using simulation. The uncertainty $\sigma_{DSA}$ may be determined through simulating a BCP feature. A BCP feature may be simulated using software implemented on a computer. For example the Dynamic Density Functional Theory (DDFT) software package sold by Chemistry Unified Language Interface (CULGI B.V. of Leiden, the Netherlands) may be used to simulate a BCP feature. In general any software utilizing a thermodynamic theory based on self-consistent field theory (SCFT) may be used to simulate a BCP feature. The behavior of a BCP feature 7 may be subject to a large number of interacting molecules.

Figure 3A:
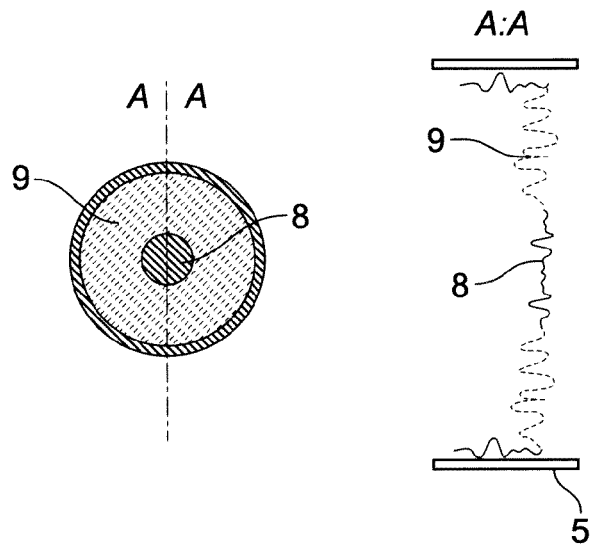
FIG. 3A is a schematic example of the example chemical nature of the formation of a single block copolymer feature, such as shown in FIG. 1.
Figure 3B:
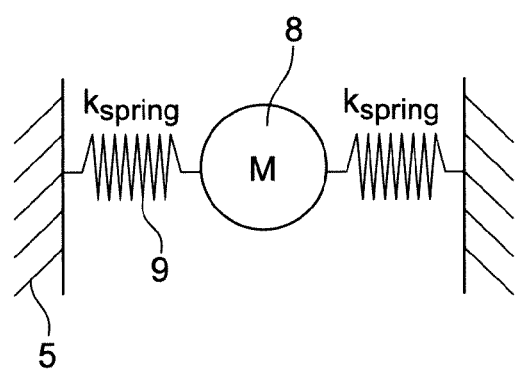
FIG. 3B is a schematic diagram of the example mechanical nature of the formation of a single block copolymer feature, such as shown in FIG. 1.

A BCP feature 7 may however be simulated as a thermodynamic system and the macroscopic properties of the BCP feature may be determined through statistical mechanics. For example, without being bound by any theory, FIG. 3A is a schematic example of the example chemical nature of the formation of a single block copolymer feature, such as shown in FIG. 1. The right hand side of FIG. 3A depicts, in this case, a type A polymer domain 8 formed as, for example, a cylinder and surrounded by continuous type B polymer domain 9 within a recess 5. The type A polymer domain 8 may, for example, comprise polymethylmethacrylate (PMMA) monomer. The type B polymer domain 9 may, for example, comprise polystyrene (PS) monomer. In this case, a second type A polymer domain (e.g. PMMA) is positioned around the periphery of the type B polymer domain 9. The second type A polymer domain is in contact with the wall(s) of the recess 5. On the left hand side of FIG. 3A, the general chemical nature of the formation of the block copolymer feature is depicted through line A-A depicted on the right hand side. Further, without wishing to be bound by any theory, FIG. 3B is a schematic diagram of the example mechanical nature of the formation of a single block copolymer feature, such as shown in FIG. 1. The block copolymer feature of FIG. 3A is depicted as a mechanical spring system. In this case, the type A polymer domain 8 is depicted as a mass connected to the wall(s) of the recess 5 by a spring representing the type B polymer domain 9. The uncertainty of the position of the block copolymer feature can thus be understood when viewing the block copolymer as a spring with a spring constant $k_{spring}$.

Figure 4A:
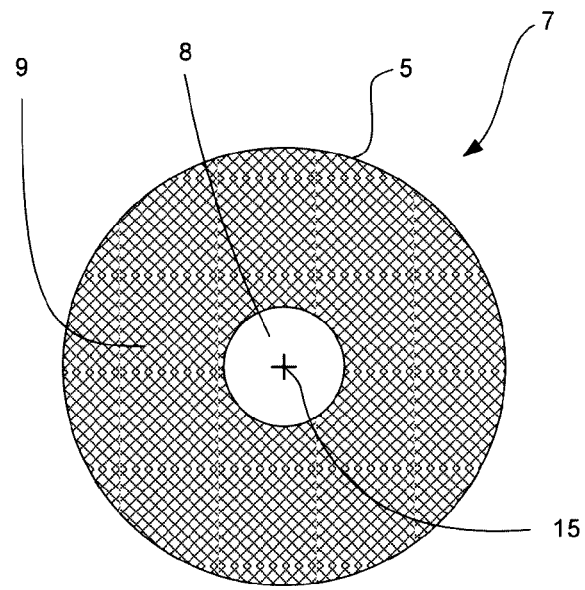
FIGS. 4A and 4B schematically depict an A-B block copolymer feature, wherein the position of a polymer domain is controlled by applying a potential to the feature.

FIG. 4A schematically depicts a BCP feature 7 formed inside a recess 5, which in this embodiment is round. The BCP feature 7 comprises a type A polymer domain 8 and a type B polymer domain 9. The type A polymer domain 8 is formed as a cylinder and is surrounded by the continuous type B polymer domain 9. The type A polymer may preferentially assemble substantially towards the geometric center 15 of the recess 5 (although it may preferentially assemble to a different location depending on the shape and nature of the recess 5; hereafter the location in the recess 5 where the domain 8 is designed to preferentially self-assemble is referred to as the designed self-assembly location). The type B polymer may preferentially assemble so as to surround the type A polymer domain 8. As was described above, the BCP feature 7 may further comprise a second type A polymer domain which surrounds the type B polymer domain and preferentially assembles alongside the boundary of the recess 5 (the second type A polymer domain is omitted from FIG. 4A). The BCP feature 7 may further comprise one or more further polymer domains which may be type A polymer domain, type B polymer domain or other type polymer domain (e.g. type C polymer domain).

The position of the type A domain 8 within the type B domain 9, depicted in FIG. 4A is the position which the type A domain 8 tends to when the BCP feature relaxes into a minimum energy state. This state may equivalently be considered as a state which minimizes the Gibbs free energy of the BCP feature and is therefore a state of thermodynamic equilibrium.

Although the type A polymer preferentially assembles substantially towards the designed self-assembly location (e.g., the geometric center 15) of the recess 5, the BCP feature 7 may take up an energy state other than the minimum energy state (e.g., due to the thermal energy that is present during the annealing). In an energy state other than the minimum energy state, the type A polymer domain may assemble at a position which is displaced from the designed self-assembly location 15 of the recess 5. Put differently there is a non-zero probability that the type A polymer domain may assemble at a position which is displaced from the designed self-assembly location 15 of the recess 5. The probability of the type A polymer domain 8 to assemble at a displaced position may be represented by a distribution of the probability that the type A polymer domain 8 will assemble at different displacements from the designed self-assembly location 15 of the recess 5. This may be referred to as a probability distribution of the displacement of the type A polymer domain 8. This probability distribution may be used to calculate the uncertainty $\sigma_{DSA}$.

Figure 5:
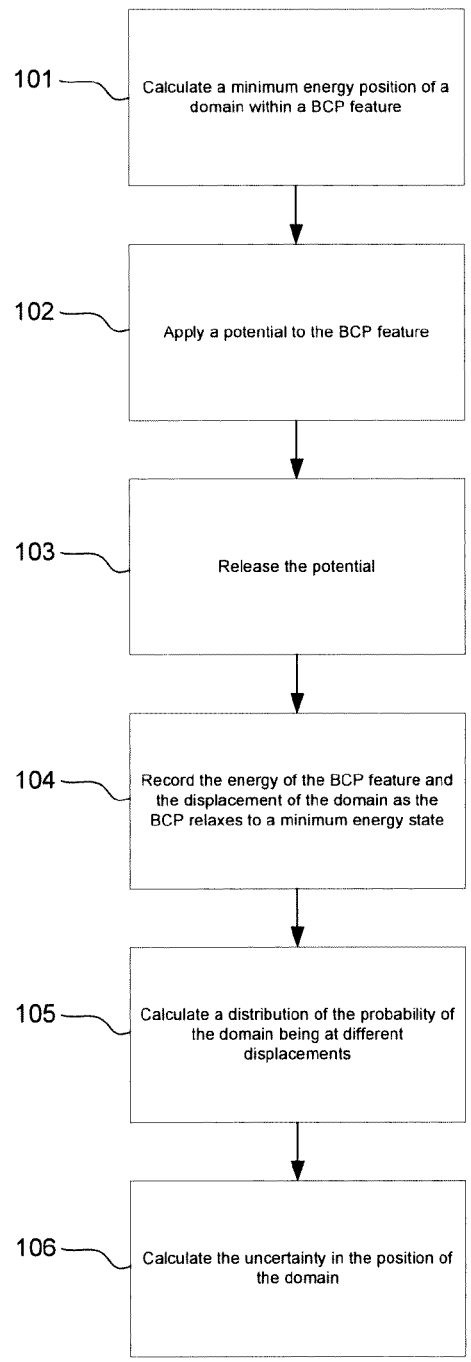
FIG. 5 is a flow diagram of a method of determining an uncertainty in the position of the polymer domain of FIG. 4 within a block copolymer feature.

A method for calculating the uncertainty $\sigma_{DSA}$ in the position of a type A polymer domain within a BCP feature is depicted in the flowchart of FIG. 5. The BCP feature is simulated using software implemented on a computer (e.g. DDFT software package referred to above). At step 101 a minimum energy position of the type A polymer domain 8 is calculated. The minimum energy position is the position of the type A polymer domain 8 at an energy state of the BCP feature 7 which is substantially a minimum energy state. At the minimum energy state the BCP feature 7 is in thermodynamic equilibrium. The minimum energy position may, for example, be at the designed self-assembly location (e.g., geometric center) of the BCP feature 7. The simulation of the BCP feature 7 may be designed to minimize the energy of the BCP feature 7. The minimum energy position is therefore found by allowing the simulation to minimize the energy of the BCP feature 7 and recording the position of the type A polymer domain 8, within the BCP feature 7, once the energy is minimized.

At step 102 a potential is applied to the simulation of the BCP feature 7. The potential may, for example, comprise an increase in the chemical potential of the BCP feature. The simulation may have an intrinsic chemical potential associated with the BCP feature 7. The potential may be applied by increasing the intrinsic chemical potential in the simulation. The chemical potential may be increased at a specific position in the simulated BCP feature 7. This may attract the type A polymer domain 8 towards the position at which the potential is applied (e.g. the position at which the chemical potential is increased). This results in a displacement of the type A polymer domain 8 from the minimum energy position. The displacement of the type A polymer domain 8 may be a lateral displacement, i.e. the polymer domain 8 may only be displaced in an x and/or y direction and may not be displaced in a direction towards or away from the substrate 1.

In general terms, while software exists to simulate BCP features such as the simulated BCP feature 7, such simulation software would, by default, simulate BCP features with a minimum energy. As such, for a simulated BCP feature 7, such software would position the type A polymer domain 8 in the minimum energy position. Applying a potential to the simulation of the BCP feature 7 perturbs the simulation from its default state and causes a displacement of the type A polymer domain 8 from the minimum energy position.

Figure 4B:
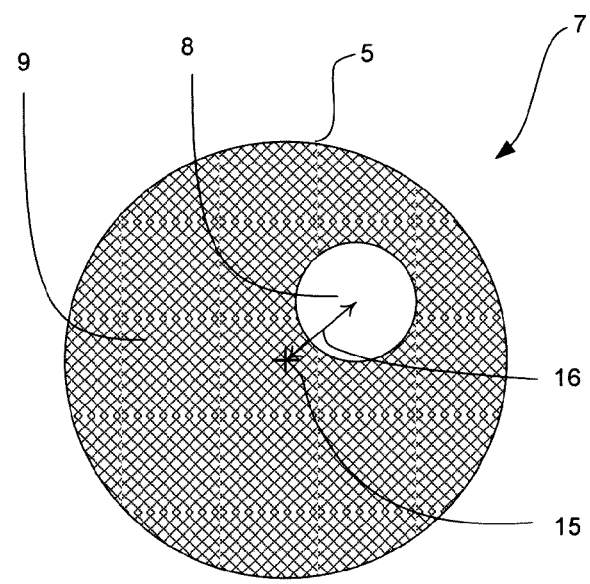

FIG. 4B schematically depicts a BCP feature 7 formed inside a recess 5 after a potential is applied to the BCP feature 7. The potential applied to the BCP feature 7 results in a displacement 16 of the type A domain from the designed self-assembly location 15 of the BCP feature 7. The potential applied to the BCP feature also causes the energy of the BCP feature 7 to increase, thus disturbing the BCP feature from thermodynamic equilibrium.

At step 103 of FIG. 5, the potential is released from the simulated BCP feature 7. Releasing the potential allows the simulation of the BCP feature 7 to return to its default state and thus the BCP feature 7 relaxes to thermodynamic equilibrium and returns to the minimum energy state. The simulation of the BCP feature 7 may return to the minimum energy state in a series of iterations. For each iteration the energy is reduced by a small amount and the position of the type A polymer domain 8 for that energy is calculated.

At step 104 a plurality of energies of the BCP feature 7 are recorded as the BCP feature 7 relaxes to the minimum energy state. The energies may be recorded as an energy difference $\Delta E$ from the minimum energy state. The energy difference may be scaled by the factor kT, where k is the Boltzmann constant and T is the temperature of the BCP feature 7. The scaled energy difference $\Delta E/kT$ may therefore be recorded. The displacement of the type A polymer domain 8 from the minimum energy position is also recorded at each of the plurality of energies of the BCP feature 7.

The output of the DDFT software package may be images which show the BCP feature. The displacement of the type A polymer domain 8 from the minimum energy position may be measured by capturing and analyzing images output from the DDFT software package. This may be done using any suitable image analysis software.

Figure 6:
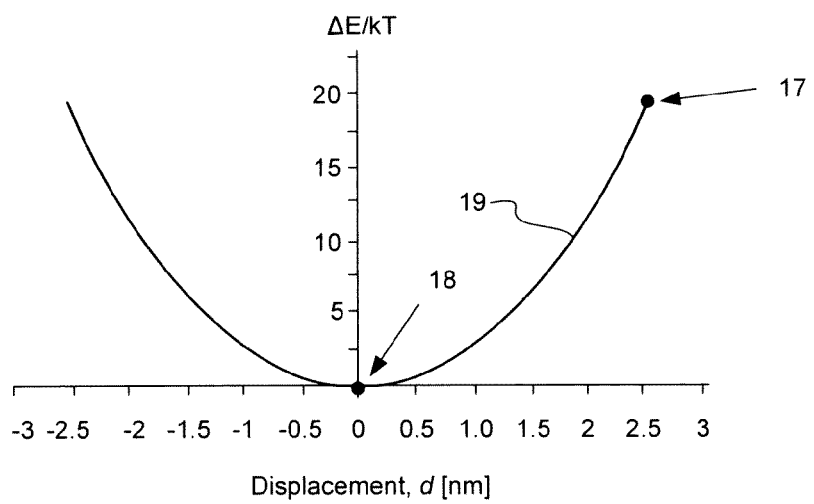
FIG. 6 is a schematic graph of the energy of the block copolymer feature depicted in FIG. 4 as a function of the displacement of the polymer domain.

FIG. 6 is a schematic graph of the scaled differences in energy $\Delta E/kT$ from the minimum energy state of the BCP feature 7 as a function of the displacement of the type A polymer domain 8 from the minimum energy position. Point 17 of FIG. 6 represents the BCP feature 7 in a state at which the type A polymer domain 8 is displaced from the minimum energy position. Point 18 of FIG. 6 represents the BCP feature 7 in the minimum energy state. The curve 19 of FIG. 6 represents the energy of the BCP feature 7 and the displacement path along which the type A polymer domain 8 returns to the minimum energy position after the potential is released. The curve 19 is determined by the recording of the energy of the BCP feature 7 and the displacement of the type A polymer domain during step 104. The behavior of the BCP feature 7 may be a result of the polymers which comprise the BCP feature 7 acting as entropic springs.

Applying a potential to the simulation of the BCP feature 7 may in practice displace the type A polymer domain 8 beyond the point 17 depicted in FIG. 6. However one or more steps of the simulation may be run after releasing the potential before the energy of the BCP feature 7 and the displacement of the type A polymer domain are recorded. For example, the point 17 may represent the first point at which the energy of the BCP feature 7 and the displacement of the type A polymer domain are recorded. However, the type A polymer domain may have been displaced beyond point 17 when the potential was applied. The one or more steps of the simulation in between the release of the potential and the recording of the energy of the BCP feature 7 and the displacement of the type A polymer domain 8 may help ensure that the potential has been completely removed from the simulation.

For any given simulation, the BCP feature 7 only returns along one half of the curve 19. The half of the curve 19 along which the BCP feature 7 returns is determined by the direction of the displacement of the type A polymer domain. The direction of the displacement of the type A polymer domain is determined by the position at which the potential is applied. In the example shown in FIG. 6, the BCP feature 7 and the curve 19 are substantially symmetric and the full curve 19 may therefore be determined from a single simulation. A non-symmetric BCP feature may require a plurality of simulations to be performed. For example, the plurality of simulations may each comprise applying a potential which causes a displacement of the type A polymer domain 8 in a different direction. The simulations may then allow a curve 19 of the energy state of the BCP feature 7 as a function of the displacement of the type A polymer domain 8 to be constructed for each of the displacement directions used in the plurality of simulations.

Figure 7:
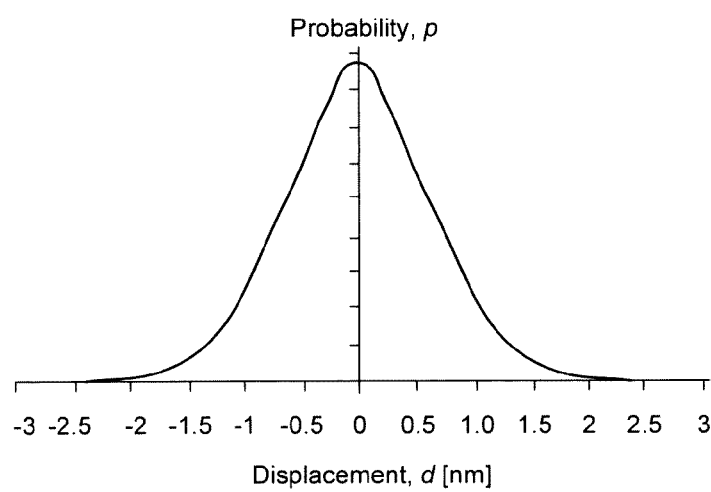
FIG. 7 is a schematic graph of the probability of the polymer domain having different displacements.

At step 105 of FIG. 5 a distribution of the probability p of the type A polymer domain being at different displacements d from the minimum energy state is calculated. FIG. 7 is a schematic graph of one such probability distribution. The probability distribution represents the probability that the type A polymer domain 8 will assemble at different displacements from the minimum energy position when no potential is applied to the BCP feature 7. The probability distribution is calculated, for example, from the curve 19 of FIG. 7.

Interactions between the large numbers of molecules which comprise the BCP feature 7 results in an element of randomness to the behavior of the BCP feature 7. This results in a non-zero probability that the BCP feature 7 will adopt an energy state other than the minimum energy state even when no potential is applied. For a given plurality of BCP features 7, the different BCP features 7 may adopt a number of different energy states. The distribution of energy states adopted by the plurality of BCP features 7 may be considered to follow a Boltzmann distribution. The distribution of energy states results in a distribution of displacements d of the type A polymer domain 8 from the minimum energy position. This gives rise to a distribution of the probability that any given BCP feature 7 will have a type A polymer domain which is displaced from the minimum energy position. For the cylindrical BCP feature 7 depicted in FIG. 5 the probability distribution may be calculated according to equation (2):

$$p(d) = c\left(e^{\frac{-\Delta E(d)}{kT}}\right) \quad (2)$$

where p(d) is the probability of a type A polymer domain 8 having a displacement d from the minimum energy position, ΔE(d)/kT is the scaled difference in energy from the ground state energy when the type A polymer domain 8 has a displacement d, and c is a normalization constant. The normalization constant c is set to ensure that the integral of the probability distribution is equal to 1. The function ΔE(d)/kT was determined during step 104 and is represented by the curve 19 shown in FIG. 6. The determination of ΔE(d)/kT during step 104 allows the probability distribution p(d) to be calculated across a range of displacements d using equation (2). The results of a calculation of the probability distribution p(d) are shown in FIG. 7.

At step 106 of FIG. 5 the uncertainty $\sigma_{DSA}$ in the position of the type A polymer domain within the BCP feature 7 is calculated from the probability distribution p(d). The uncertainty $\sigma_{DSA}$ may, for example, be calculated by fitting a Gaussian distribution to the probability distribution. A Gaussian distribution of the probability p as a function of displacement d is given by equation (3):

$$p(d) = \frac{1}{s\sqrt{2\pi}} e^{\left(\frac{-(d)^2}{2s^2}\right)} \quad (3)$$

where s is the standard deviation of the Gaussian distribution. The uncertainty $\sigma_{DSA}$ in the positioning of a type A polymer domain 8 within a BCP feature 7 may be considered to be equal to the standard deviation s of the Gaussian distribution of equation (3).

The standard deviation s, and therefore the uncertainty $\sigma_{DSA}$, may be determined by fitting a Gaussian distribution to the probability distribution. A Gaussian distribution may be fitted to the probability distribution using a known numerical method to determine a value of s which minimizes a difference between the Gaussian distribution and the probability distribution. The numerical method may, for example, comprise performing a least squares fit between the Gaussian distribution and the probability distribution. The value of the standard deviation s derived from a least squares fit may be considered to be the uncertainty $\sigma_{DSA}$.

If the curve 19 of FIG. 6 is a perfect parabola (i.e. ΔE/kT=mx² where m is a constant) then the probability distribution p(d) is a Gaussian distribution and therefore the fitted Gaussian distribution will fit the probability distribution perfectly.

Figure 8:
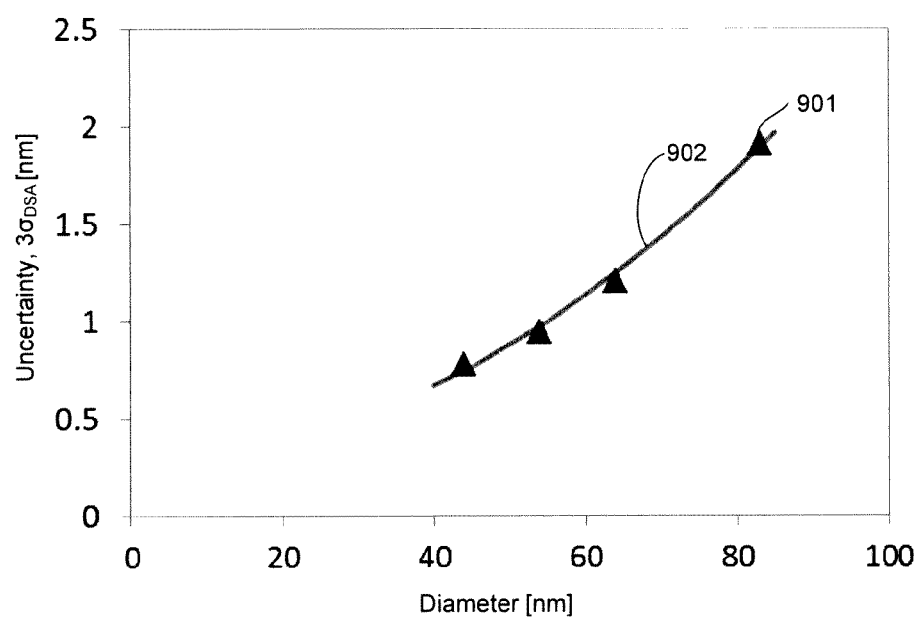
FIG. 8 is a schematic graph of the calculated uncertainty in the position of the polymer domain within a block copolymer feature as a function of the diameter of the block copolymer feature.
Figure 9:
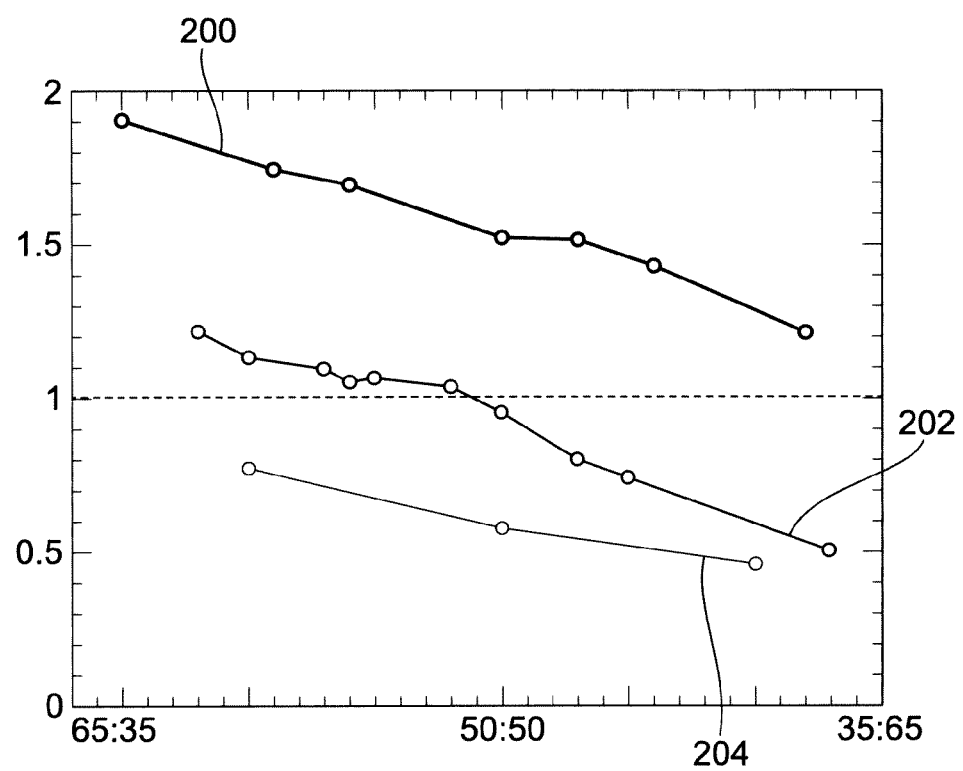
FIG. 9 is a schematic graph of uncertainty (placement error) in the position of a polymer domain within a block copolymer feature versus the ratio of type B to type A block copolymer for various contact hole (via) sizes.

FIG. 8 is a schematic graph of calculated $3\sigma_{DSA}$ uncertainties in the position of a type A polymer domain 8 within a block copolymer feature 7 as a function of the diameter of the block copolymer feature 7. Points 901 are determined using a method disclosed herein. FIG. 9 shows that the $3\sigma_{DSA}$ uncertainty decreases as the diameter of a BCP feature 7 is decreased. Line 902 is a quadratic fit to the points 901.

FIG. 9 is a schematic graph of uncertainty (placement error) in nanometers versus the ratio of type B to type A block copolymer (in this case, the ratio of polymethylmethacrylate (PMMA) to polystyrene (PS)) for various contact hole sizes. Line 200 represents a contact hole size of 83 nm, line 202 represents a contact hole size of 63 nm and line 204 represents a contact hole size of 53 nm. The values of lines 200, 202 and 204 are determined using a method disclosed herein. FIG. 9 shows that the uncertainty generally decreases as the block copolymer ratio of type B to type A block copolymer decreases (i.e., from a cylindrical phase formed with the discontinuous domains being cylinders of the lower volume block to an inverted cylindrical phase with the discontinuous domains being cylinders of the higher volume block). Further, as supported by FIG. 8, the uncertainty generally decreases with the decrease in size of contact hole. However, as can been seen in FIG. 9, in some circumstances, the uncertainty may be, for example, larger for a smaller contact hole at a particular ratio of type B to type A block copolymer than a larger contact hole at a different ratio of type B to type A block copolymer. Further, if a target uncertainty is adopted for satisfactory placement of the block copolymer feature (e.g., 1 nm as marked by the dotted line), it can be seen that uncertainty less than the target uncertainty can be obtained with a contact hole size of 63 nm at a ratio of around 50:50 or less and with a contact hole size of 53 nm at ratios between the cylindrical (65:35) and the inverted physical (35:65) phases. Uncertainty versus various ratios of type B to type A block copolymer at other contact holes sizes can be obtained by extrapolation or interpolation.

Figure 10:
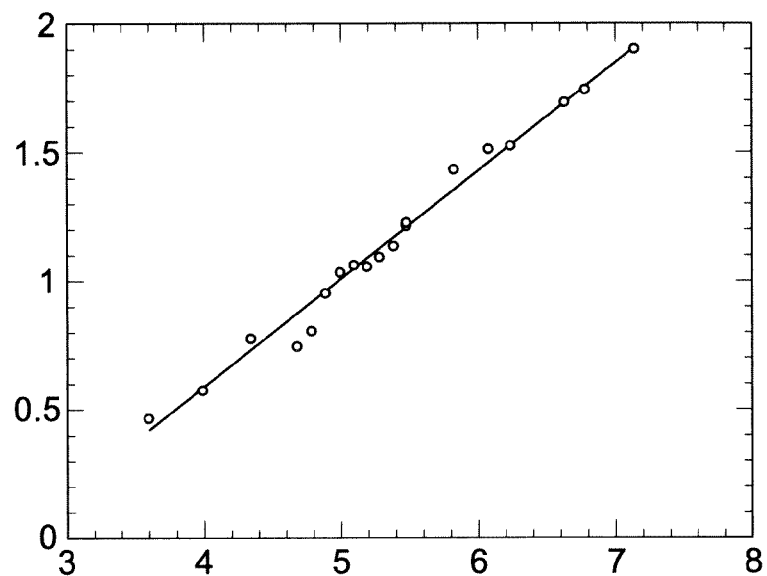
FIG. 10 depicts a plot of uncertainty (placement error) in the position of a polymer domain within a block copolymer feature against the square root of the length of a polymer of the block copolymer.

Nevertheless, it would be beneficial to have a simple model to determine the uncertainty (placement error). FIG. 10 depicts a plot of the placement error (uncertainty) in nanometers obtained in FIG. 9 against the square root of the polystyrene (PS) length of the PS-PMMA block copolymer (in number of beads). As can be seen, it has been discovered that there is essentially a linear fit. Thus, using this correlation, the placement error can be predicted based on the PS length of the block copolymer. While reference herein is made to the length of PS in a PS-PMMA block copolymer, the correlation should hold for other polymers in a block copolymer.

Without being bound by any theory, this correlation may be explained for a single contact hole when taking into account that the polymer can be regarded as a spring in a mass-spring type system. Referring back to FIG. 3B, the spring constant $k_{spring}$ of the polymer can be expressed as:

$$K_{spring} = \frac{3kT}{Nb^2} \quad (4)$$

where k is the Boltzmann constant, T is the temperature, N is the number of monomer (e.g. PS) segments and b the Kuhn length of a polymer (the length over which a polymer is considered stiff). The (free) length of the polymer can be expressed as Nb. To determine the placement error, a probability function ρ can be expressed in a standard Gaussian as:

$$\rho = \exp(-\Delta E/kT) = \exp(-\tfrac{1}{2}x^2/\sigma^2) \quad (5)$$

where σ is the placement error and x is the position. The delta free energy ΔE can be expressed as:

$$\Delta E/kT = \tfrac{1}{2} K_{spring} x^2 \quad (6)$$

From equations (5) and (6), the relation between the placement error and the spring constant can be derived:

$$K_{spring} = 1/\sigma^2 \quad (7)$$

The relation between placement error and polymer length is obtained when combining equations (4) and (7) and yields:

$$\sigma = \frac{b\sqrt{N}}{\sqrt{3kT}} \quad (8)$$

Equation (8) predicts that the placement error in a single contact hole is proportional to the square root of N, which is the number of PS segments (bead). Thus, for a single block copolymer feature, the placement error is proportional to the PS length, or more generally the length of a polymer of the block copolymer.

Figure 11A:
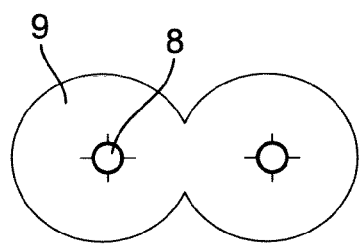
FIG. 11A schematically depicts the expected placement of the polymer domain within each of two adjacent block copolymer features, such as shown in FIG. 2.
Figure 11B:
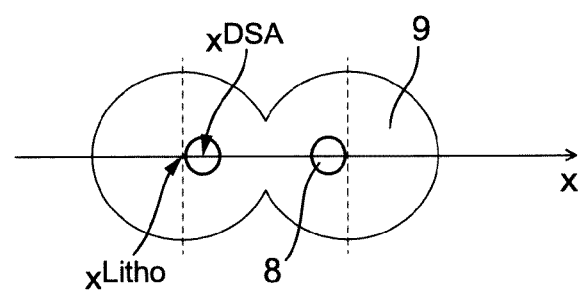
FIG. 11B schematically depicts the placement error of the polymer domain within each of the two adjacent block copolymer features as shown in FIG. 11A.

Now, consideration will be made of a plurality of block copolymer features that are adjacent to each, that is the polymer of one of the block copolymer features interacts with the polymer of another one of the block copolymer features (e.g., where the block copolymer features share a recess). FIG. 11A schematically depicts the expected placement of the polymer domain within each of two adjacent block copolymer features (e.g., contact holes). For a moment ignoring placement error as discussed above, one might expect the polymer domain in each of two adjacent block copolymer features to form at the designed self-assembly location (e.g., the center or central part) of the respective recess portions, indicated by the placement of the domains 8 on the respective crosses. In practice, there is an offset associated with one or both polymer domains within the adjacent block copolymer features (e.g., contact holes) from the designed self-assembly location of the respective recess portions irrespective of placement error. FIG. 11B schematically depicts the offset of the polymer domain within each of the two adjacent block copolymer features of FIG. 11A. One, or both, of the polymer domains tends to go inward with respect to the designed self-assembly locations (e.g., centers or central portions) of the recess portions (which locations themselves may have a placement error of their own due to, e.g., errors or stochastic effects). The amount of that inward movement is offset $\Delta x = X^{DSA} - X^{litho}$ (and is separate from any placement error).

Without being bound to any theory, a reason why the domains 8 may go inward is due to the stiffness of the domain 9 (e.g., PS domain) in between the domains 8 (e.g., PMMA domain). This stiffness is lower than that of the domain 9 between the wall(s) of the recess 5 and the respective domains 8.

Figure 12:
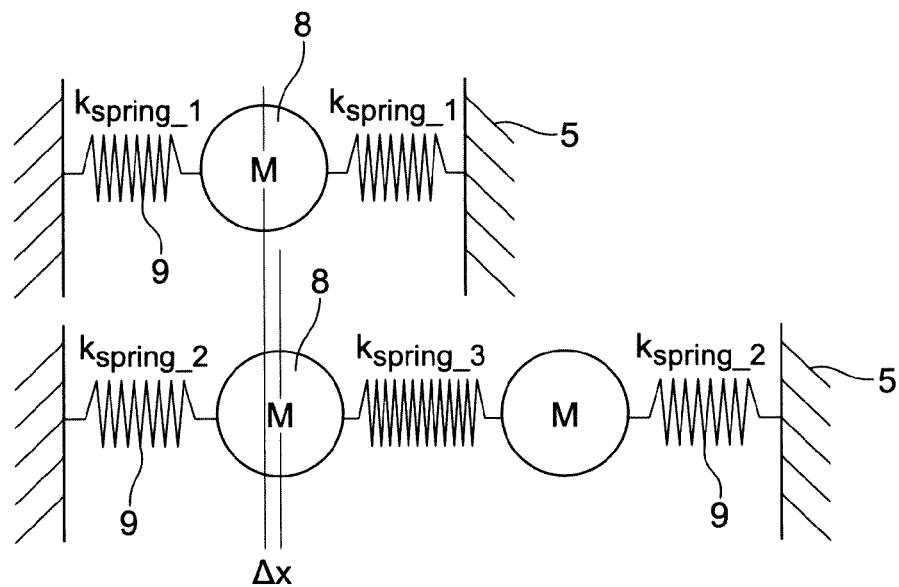
FIG. 12 is a schematic diagram comparing the example mechanical nature of the formation of a single block copolymer feature (top) against the example mechanical nature of the formation of two adjacent block copolymer features (bottom), such as shown in FIG. 2.

FIG. 12 is a schematic diagram comparing the example mechanical nature of the formation of a single block copolymer feature (top) against the example mechanical nature of the formation of two adjacent block copolymer features (bottom). In the single and double block copolymer feature examples, the $K_{spring\_1}$ and $K_{spring\_2}$ are substantially constant. So, if there is a shift of the domain 8 with respect to the recess 5 when going from a single block copolymer feature (e.g., a single contact hole) shown in the top of FIG. 12 to two adjacent block copolymer features (e.g., two contact holes) shown in the bottom of FIG. 12, it is likely due to a weaker $K_{spring\_3}$. This suggests that a weaker $K_{spring\_2}$ may improve placement.

Figure 13:
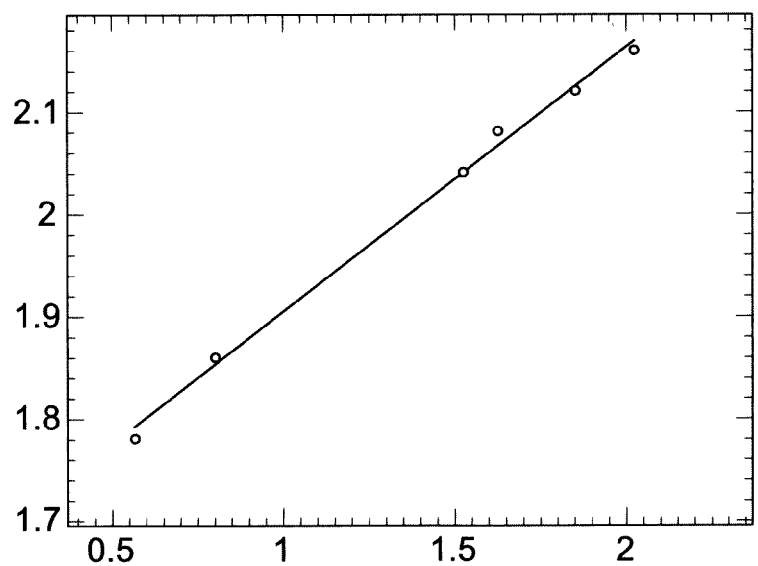
FIG. 13 depicts a plot of uncertainty (placement error) of the polymer domain within each of two substantially equal adjacent block copolymer features against the square root of the offset between the position of the polymer domains within the adjacent block copolymer features and the designed self-assembly location of the recesses associated with each of the adjacent block copolymer features.

As shown in FIG. 13, plotting uncertainty (placement error) $\sigma_2$ in nanometers against $\sqrt{\Delta X}$ in nanometers yields an essentially linear relationship. Thus, the uncertainty (placement error) of two adjacent block copolymer features can be determined knowing the placement error ($\sigma_1$) of a single block copolymer feature and the offset ($\Delta X$) of the domains 8 of the adjacent block copolymer features relative to their designed self-assembly locations for the recess.

Having the uncertainty $\sigma_{DSA}$, the combined uncertainty $\sigma_A$ associated with the positioning of a type A polymer domain 8 on the substrate 1 may be calculated from the determined uncertainty $\sigma_{DSA}$ and the known uncertainty $\sigma_{lith}$ according to equation (1). For a lithographic application the value $3\sigma_A$ may be used (almost all features may be assumed to fall within $3\sigma_A$ of the desired position). Thus, the methods disclosed herein to determine the $\sigma_{DSA}$ uncertainty may therefore be used to determine the uncertainty which may be expected to occur in practical implementation of device manufacture using self-assembly block copolymer.

Determined positioning uncertainty of block copolymer features may be taken into account during the design and/or manufacture of a component (e.g., a device) using self-assemblable block copolymer. Knowledge of the $\sigma_A$ and/or $\sigma_{DSA}$ uncertainty in the positioning of a polymer domain within a BCP feature may be used to design a pattern of features to be formed on a substrate. The knowledge may also be used to design a component which comprises the pattern of features. For example, a pattern of features having reduced feature size and/or feature separation may be achieved. For example the width of a BCP feature may be reduced in order to reduce the $\sigma_A$ and/or $\sigma_{DSA}$ uncertainty in the positioning of a polymer domain within the BCP feature.

A pattern of features, once designed taking into account the calculated probability distribution of BCP features, may be formed on a substrate. The pattern of features may, for example, form part of a component, e.g. an integrated circuit.

Referring to FIG. 13, an embodiment of a design process is depicted that incorporates the use of uncertainty in the design and/or manufacture of a component (e.g., a device) using self-assemblable block copolymer. In this process, a prediction may be made in advance of manufacture of how the block copolymer interacts with the pattern (e.g., printed lithography pattern) used to guide the self-assembly of the block copolymer. Further, the process may enable the calculation of the inverse problem namely knowing where the block copolymer feature should be located, determining, for example, the type of block copolymer that should be used and/or the pattern to be used to guide the self-assembly of the block copolymer.

At step 300, the initial design of the desired arrangement/pattern of the one or more self-assembled block copolymer features is provided. There may also be one of more constraints (rules) provided with respect to in what manner the initial design may be redesigned during the process. Such one or more rules may indicate, for example, by how much particular block copolymer features may shift and still be satisfactorily located. At step 300, the particular block copolymer to be used may be provided. There may also be one of more constraints (rules) provided with respect to in what manner the block copolymer may be redesigned during the process. Such one or more rules may indicate, for example, by how much the ratio of one polymer of the block copolymer may change with respect to another polymer of the block copolymer, whether one or more polymers may be added to, removed from or substituted in the block copolymer, etc.

Figure 14:
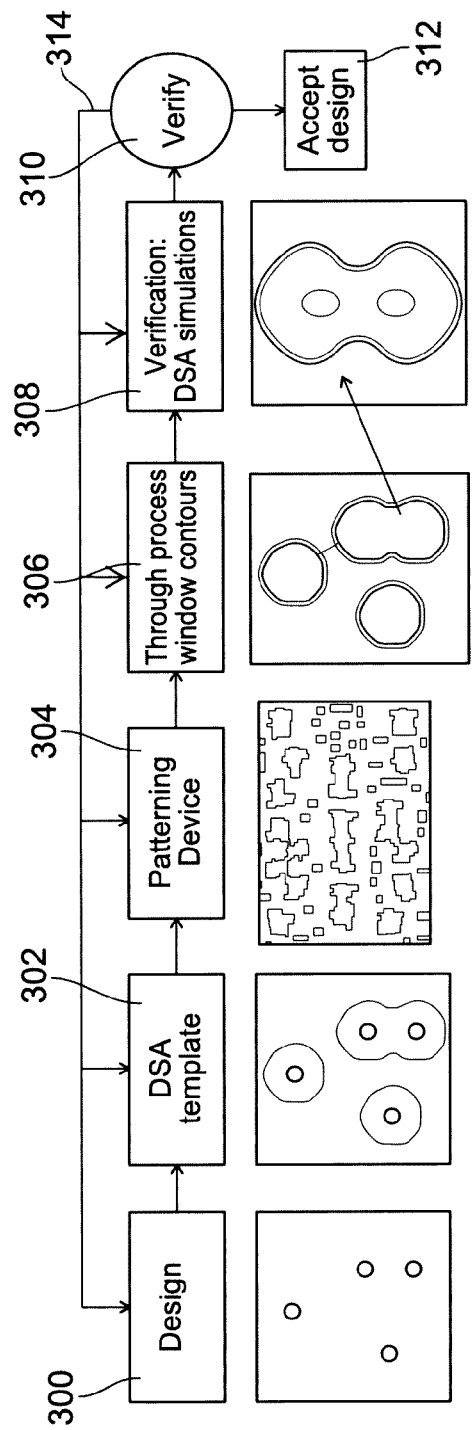
FIG. 14 is a schematic diagram of a method of designing a self-assembly process and its components.
Figure 15:
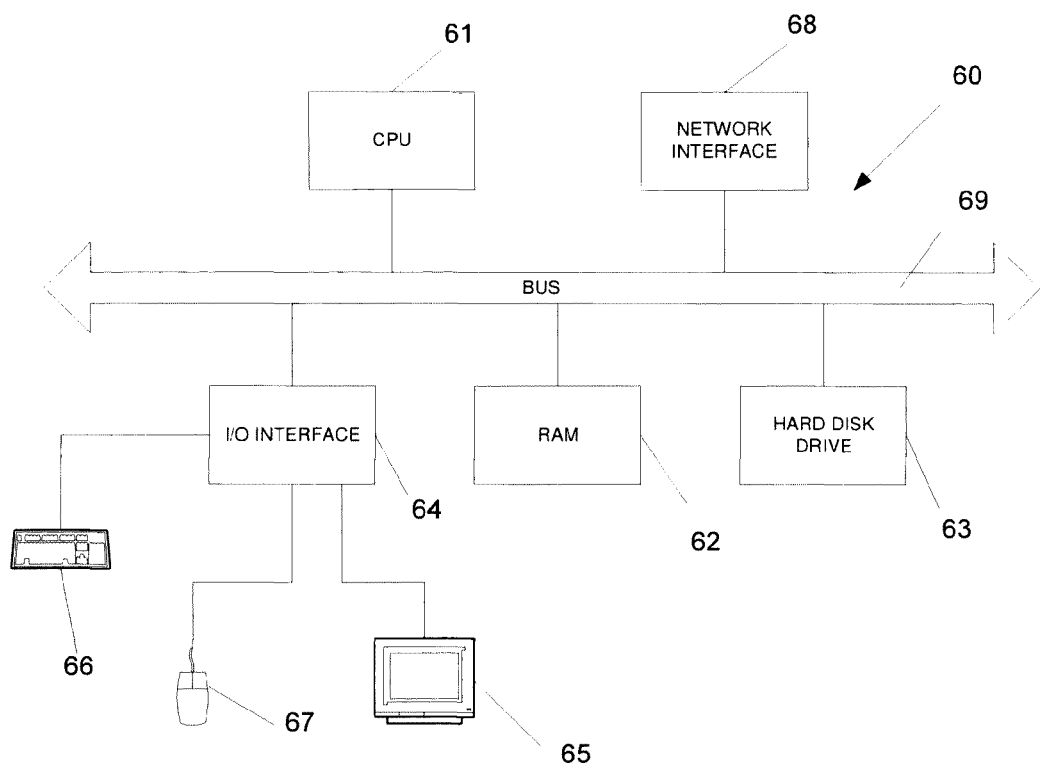
FIG. 15 is a schematic depiction of a computer suitable for implementing an embodiment.

At step 302, the design for the template on the substrate that is used to guide the self-assembly of the block copolymer is determined. A directed self-assembly block copolymer model is used to translate the initial design to a directed self-assembly block copolymer template. There may be one of more constraints (rules) with respect to in what manner the template may be designed or redesigned during the process. Such one or more rules may indicate, for example, by how much a portion of a wall of a recess may be near another portion of the wall or another wall, etc. In an embodiment, the directed self-assembly block copolymer model for template design is a fast model or set of rules that does not rely significantly on computationally heavy simulations. In an embodiment of a fast model or set of rules for template design, the model may include a plurality of different standard block copolymer feature patterns and an associated template recess shape for each such pattern to form that pattern. The model can then analyze the input desired block copolymer feature pattern to identify one or more of the plurality of different standard block copolymer feature patterns and then add the associated template recess shape to the overall template recess shape design. For example, as seen in FIG. 14, the isolated contact holes in the design at step 300 can be identified and associated round template recess shapes are added to the template design at step 302. Similarly, the pair of adjacent contact holes in the design at step 300 can be identified and an arrangement of overlapping circular recess shapes may be added to the template design at step 302. See, e.g., U.S. patent application publication no. 2012/0331428, filed Sep. 7, 2012, which is incorporated herein its entirety by reference. One or more of the techniques described in published in U.S. patent application publication no. 2012/0331428 may incorporated in a method as described herein. In an embodiment, the fast model or set of rules for template design does not perform any simulations but rather exclusively relies on look-up and/or formula calculations. In an embodiment, the fast model or set of rules for template design is a rule-based model, i.e., it relies, similar to rule-based OPC, on simple geometric rules to determine the designs and/or modifications which are to be applied as distinguished from relying on extensive lithography simulation and iteration to make the designs and/or modifications (like model-based OPC).

At step 304, the pattern of a patterning device (e.g., of an imprint template, of an optical lithography mask, of electron beam writer, etc.) used to create the template on the substrate used to guide the self-assembly of the block copolymer is determined. And, at step 306, the transfer and printing of the patterning device pattern is simulated/calculated to arrive at the printed template on the substrate used to guide the self-assembly of the block copolymer. One or more known computational lithography products, such as the ASML Tachyon computational lithography software products, can be used to calculate the pattern and simulate/calculate the transfer and printing of the pattern. For example, where the patterning device is an optical lithography mask, an optical proximity correction product can be used to calculate the mask pattern for the mask, including applying one or more reticle enhancement techniques (RET) such as scatter bars, serifs, etc., and a source-mask optimization (SMO) can optimize or match the illumination parameters with the mask pattern, all with the aim to print the pattern of the patterning device into the desired template on the substrate used to guide the self-assembly of the block copolymer template. There may be one of more constraints (rules) with respect to the manner in which the pattern of the patterning device and/or transferring and printing (e.g., the resist choice, the illumination, etc.) of the patterning device pattern may be designed or redesigned during the process.

At step 308, a placement error verification analysis is performed for the simulated/calculated self-assembly of block copolymer applied to the printed pattern determined at step 306. In an embodiment, the placement error of one or more block copolymer features is simulated and/or calculated using one or more of the methods described herein and compared to a threshold to determine whether the placement of the one or more block copolymer features is acceptable.

In an embodiment, the placement error threshold is less than or equal to 5 nm, less than or equal to 4, less than or equal to 3 nm, less than or equal to 2 nm, or less than or equal to 1 nm. A directed self-assembly block copolymer model is used to quantify and validate the placement error of the one or more block copolymer features and optionally determine the expected dimensions of the one or more self-assembled block copolymer features. In an embodiment, the directed self-assembly block copolymer model for placement error verification is a fast model or set or rules that does not rely significantly on computationally heavy simulations. In an embodiment of a fast model or set of rules for placement error verification, the placement error and dimensions of various single block copolymer features (e.g., a contact hole of varying size) are calibrated based on rigorous and/or substrate simulations for various given block copolymers. The placement error for adjacent features can be extrapolated based on the formulaic approach discussed above in respect of FIGS. 11-13, For example, based on a look-up table and/or formula calculation, the relation between (1) the placement error and the properties of the BCP–length of the second polymer type (FIG. 10) and (2) between the offset (=difference between between X_DSA and X_litho in FIG. 11B) and the placement error (FIG. 13) can be verified. In an embodiment, the fast model or set of rules for placement error verification does not perform any simulations but rather exclusively relies on look-up and/or formula calculations. In an embodiment, the fast model or set of rules for placement error verification is a rule-based model, i.e., it relies, similar to rule-based OPC, on simple geometric rules to determine the designs and/or modifications which are to be applied as distinguished from relying on extensive lithography simulation and iteration to make the designs and/or modifications (like model-based OPC).

At point 310, if it is determined that the placement error is within the threshold, the design and one or more associated self-assembly parameters (e.g., block copolymer type, self-assembly template design, etc.) may be accepted at 312 and self-assembly may proceed using, for example, the design for the template, the block copolymer selected during the design process, etc.

If it is determined that the placement error is not within the threshold, the design and/or one or more associated self-assembly parameters (e.g., block copolymer type, self-assembly template design, etc.) may be modified at 314. The modifications can take numerous forms and at various junctions in the computational design process depicted in FIG. 14. In an embodiment, two or more parameter adjustments may need to be co-optimized and one or more of those parameters may be weighted more heavily than another. For example, an adjustment may involve adjustment of the shape of the template and adjustment of a physical parameter of the block copolymer and thus the amount by which either parameter is adjusted may be performed using any known optimization technique, with or without weighting the adjustment of the shape of the template higher or lower than adjustment of the physical parameter of the block copolymer. Any of these adjustments may be made based on the amount of the placement error or an associated parameter (e.g., the offset amount and/or the length of the polymer type).

In an embodiment, the adjustment of the design and/or one or more associated self-assembly parameters may comprise adjusting a physical parameter of the block copolymer. For example, adjusting the physical parameter may comprise adjusting a ratio between the amount of a first polymer type and a second polymer type in the block copolymer. In an embodiment, adjusting the physical parameter comprises adding a further polymer type to or removing a polymer type from the block copolymer. In an embodiment, adjusting the physical parameter may comprise adjusting the length of a polymer type of the block copolymer. In an embodiment, adjusting the physical parameter may comprise adjusting a repellence between the first polymer type and the second polymer type or between the second polymer type and a portion of a template to guide the self-assembly of the block copolymer of the block copolymer feature. The adjustment to the block copolymer may be made, for example, at step 308 and then the process proceeds from step 308 using the adjusted block copolymer. Alternatively, the adjustment to the block copolymer may be made, for example, at step 302 if the template design step involves the physical nature of the block copolymer and then the process proceeds from step 302 using the adjusted block copolymer.

In an embodiment, the adjustment of the design and/or one or more associated self-assembly parameters may comprise adjusting a design of the pattern of the patterning device (e.g., of an imprint template, of an optical lithography mask, of electron beam writer, etc.) used to create the template on the substrate used to guide the self-assembly of the block copolymer is determined. For example, for an optical mask, one or more reticle enhancement techniques, such as a serif or a scatter bar, may be applied to the mask pattern based on the uncertainty. Additionally or alternatively, the adjustment of the design and/or one or more associated self-assembly parameters may comprise adjusting a parameter of the transfer and printing of the patterning device pattern. For example, for an optical mask, the illumination shape, illumination intensity, etc. may be adjusted. These adjustments may be made, for example, at step 304 and/or 306 and then the process proceeds therefrom using the applicable adjustment(s).

In an embodiment, the adjustment of the design and/or one or more associated self-assembly parameters may comprise adjusting a design of a template to guide the self-assembly of the block copolymer of the block copolymer feature. In an embodiment, adjusting the template comprises adjusting a shape of a recess portion of the template. For example, one or more template enhancement techniques, similar to reticle enhancement technique, may be applied to the template pattern based on the uncertainty. See, e.g., U.S. patent application publication no. 2012/0331428, filed Sep. 7, 2012, which is incorporated herein its entirety by reference. Alternatively or additionally, a different fundamental shape may be applied to a particular block copolymer feature than previously applied. For example, a heavily overlapping double circle recess shape or a square recess shape may be applied in the template design at step 302 for an isolated contact hole of the design shown in step 300 instead of a round recess shape as shown in the template design at step 302. These adjustments may be made, for example, at step 302 and then the process proceeds therefrom using the applicable adjustment(s).

In an embodiment, the adjustment of the design and/or one or more associated self-assembly parameters may comprise adjusting the design of the pattern of block copolymer features shown at step 300. In other words, the fundamental design of the block copolymer features may need to be redesigned because perhaps the placement error is too large for the block copolymer features to be practically created. Thus, for example, the layout of the pattern of block copolymer features may be changed in terms of feature size, feature pitch, feature layout, etc. These adjustments may be made, for example, at step 300 and then the process proceeds therefrom using the applicable adjustment(s).

In an embodiment, the adjustment of the design and/or one or more associated self-assembly parameters may comprise adjusting a repellence of a portion of a template to guide the self-assembly of the block copolymer of the block copolymer feature, to the first polymer type and/or the second polymer type.

In an embodiment, the placement error verification analysis performed at step 308 may be performed on a stand-alone basis. In other words, the placement error verification may be used as a check of whether a particular combination of template, block polymer, etc. will meet a threshold for placement error. The analysis may then provide, for example, an indication to a user that such a combination passes or fails the placement error verification analysis. Further, the amount by which the combination passes or fails may be supplied to the user or another process. For example, the amount may be used in overlay calculations for subsequent layers.

As described herein, an indication of an uncertainty in the position of the first domain within the block copolymer feature may be obtained. The uncertainty may then be used in the design, and/or manufacture, of a patterned substrate, component or device. In particular, an indication of the uncertainty allows for more confidence in the placement of a feature on a substrate. Thus, a pattern of features may be manufactured taking into account the uncertainty in position of the first domain within the block copolymer feature.

In an embodiment, an uncertainty in the position of the first domain on a substrate may be determined from the uncertainty in the position of the first domain within the block copolymer feature. In this way additional information may be provided for use in the design and/or manufacture of a substrate, component or device.

In an embodiment, the calculated uncertainty in the position of the first domain may be used to design a pattern of recesses for pre-patterning a substrate. Designing the pattern of recesses for pre-patterning a substrate may comprise simulating a lithographic process. In an embodiment, the method may further comprise pre-patterning a substrate based on the designed pattern of recesses. For example, the design may be used to imprint a plurality recesses onto a substrate, the recesses being suitable for receipt of a block copolymer for use in a self-assembly block copolymer manufacturing method.

In an embodiment, a component for manufacture using a self-assembly block copolymer may be designed based upon the calculated uncertainty in the position of the first domain within the block copolymer feature. The component may comprise, for example, a patterned substrate, a device architecture or topology, etc. In an embodiment, the method may further comprise forming a pattern of features which comprises the component on a substrate according to the design using a self-assembly block copolymer. The method may further comprise one or more additional steps such as breakthrough etching (e.g. to remove the first or second domain) and/or transfer etching.

While the design process has been described in terms of realizing a desired arrangement/pattern of one of self-assembled block copolymer features, the process may be augmented to further include simulation and/or modelling of subsequent process steps such as etching, etc. The results of such further process steps may be fed back or fed forward into the process as appropriate to further refine the initial design, the type of block copolymer, the pattern used to guide the self-assembly of the block copolymer, etc.

While the uncertainty in the position of type A polymer domain has been described, the term type A polymer domain should not be limited to a specific type of polymer domain. The terms type A polymer domain and type B polymer domain are used solely to differentiate between different polymer domains with reference to the Figures.

A recess, BCP feature, and/or first domain shape other than cylindrical as described above may be used (e.g., simulated and designed) according to an embodiment. For example, a spherical, elliptical, rectangular, lamellar, cubic, tetragonal or hexagonal feature shape may be simulated and designed using the uncertainty in the positioning of a polymer domain within the feature. Cylindrical features which are joined by a linear trench-like feature may be simulated and designed using polymer domain feature position uncertainties.

Any reference to maximum or minimum energy may not necessarily correspond to an absolute maximum or minimum energy. A maximum or minimum energy may instead refer only to a local maximum or minimum energy. Any reference to being at a maximum or minimum energy should not be limited to being precisely at the maximum or minimum energy but merely substantially at the maximum or minimum energy.

As noted above, the use of resist to form a sidewall of a recess is intended to be an example, rather than a limiting feature. For example, a recess may be provided by patterning of the substrate itself, or patterning of a layer deposited or grown onto the substrate. A recess may itself be provided by the self-assembly of BCP material.

In an embodiment, there is provided a method of design for a self-assemblable block copolymer feature, the block copolymer feature comprising a first domain comprising a first polymer type and a second domain comprising a second polymer type, the method comprising, based on the length of the second polymer type or on an uncertainty in position of the first domain within the block copolymer feature calculated based on the length of the second polymer type, adjusting a parameter of the self-assembly process of a block copolymer feature. In an embodiment, the adjusting is based on the uncertainty in position and the uncertainty in position is proportional to the square root of the length of the second polymer type. In an embodiment, the length of the second polymer type is a number of beads of the second polymer type.

In an embodiment, there is provided a method of design or verification for a self-assemblable block copolymer feature, the block copolymer feature comprising a first domain comprising a first polymer type and a second domain comprising a second polymer type, the method comprising calculating an uncertainty in the position of the first domain within the block copolymer feature based on the length of the second polymer type or an uncertainty in the position of the first domain within the block copolymer feature calculated based on the length of the second polymer type, and based on the uncertainty, adjusting a parameter of the self-assembly process of a block copolymer feature or verifying a placement of a block copolymer feature. In an embodiment, the uncertainty in position is proportional to the square root of the length of the second polymer type.

In an embodiment, there is provided a method of design for a plurality of adjacent self-assemblable block copolymer features at respective portions of a template to guide the self-assembly of the block copolymer of the block copolymer features, the block copolymer features respectively comprising a first domain comprising a first polymer type and a second domain comprising a second polymer type, the method comprising, based on an offset between a designed self-assembly location of one of the template portions and the position of the first domain within the self-assembled block copolymer feature at that designed self-assembly location or on an uncertainty in the position of the first domain within the block copolymer feature calculated based on the offset, adjusting a design of the template or adjusting a physical parameter of the block copolymer. In an embodiment, the adjusting is based on the uncertainty in position and the uncertainty in position is proportional to the square root of the offset. In an embodiment, the adjusting is based on the uncertainty in position and the uncertainty in position is further based on an uncertainty of the position of the first domain within the block copolymer feature at its respective portion of the template without the one or more other adjacent self-assemblable block copolymer features.

In an embodiment, there is provided a method of design or verification for a plurality of adjacent self-assemblable block copolymer features at respective portions of a template to guide the self-assembly of the block copolymer of the block copolymer features, the block copolymer features respectively comprising a first domain comprising a first polymer type and a second domain comprising a second polymer type, the method comprising: calculating an uncertainty in the position of the first domain within one of the block copolymer features based on an offset between a designed self-assembly location of one of the template portions and the position of the first domain within the self-assembled block copolymer feature at that designed self-assembly location; and based on the uncertainty, adjusting a parameter of the self-assembly process of a block copolymer feature or verifying a placement of a block copolymer feature. In an embodiment, the uncertainty in position is proportional to the square root of the offset. In an embodiment, the uncertainty in position is further based on an uncertainty of the position of the first domain within the block copolymer feature at its respective portion of the template without the one or more other adjacent self-assemblable block copolymer features.

In an embodiment, the adjusting comprises adjusting a physical parameter of the block copolymer. In an embodiment, adjusting the physical parameter comprises adjusting a ratio between the amount of the first polymer type and the second polymer type in the block copolymer. In an embodiment, adjusting the physical parameter comprises adding a further polymer type to or removing a polymer type from the block copolymer. In an embodiment, adjusting the physical parameter comprises adjusting the length of the first polymer type or the second polymer type of the block copolymer. In an embodiment, the adjusting comprises adjusting a design of a template to guide the self-assembly of the block copolymer of the block copolymer feature. In an embodiment, adjusting the template comprises adjusting a shape of a recess portion of the template. In an embodiment, the adjusting comprises adjusting a repellence between the first polymer type and the second polymer type or between the second polymer type and a portion of a template to guide the self-assembly of the block copolymer of the block copolymer feature. In an embodiment, the adjusting comprising using the uncertainty in the position of the first domain within the block copolymer feature to design a pattern of features; and further comprising forming the pattern of features on a substrate according to the design using the self-assembly block copolymer. In an embodiment, the first domain is surrounded by the second domain. In an embodiment, the block copolymer feature is cylindrical. In an embodiment, the first domain is cylindrical. In an embodiment, the block copolymer feature has a width of between 20 and 100 nanometers. In an embodiment, the first domain has a width of between 5 and 50 nanometers. In an embodiment, the first domain is polymethylmethacrylate and the second domain is polystyrene.

In an embodiment, there is provided a method of design or verification for a patterning process comprising self-assembly of a block copolymer feature, the block copolymer feature comprising a first domain comprising a first polymer type and a second domain comprising a second polymer type, the method comprising adjusting a parameter of the process based on the length of the second polymer type. In an embodiment, the adjusting the parameter is based on an uncertainty in position of the first domain calculated based on the length of the second polymer type. In an embodiment, the length of the second polymer type is a number of beads of the second polymer type. In an embodiment, the adjusting comprises adjusting a physical parameter of the block copolymer. In an embodiment, adjusting the physical parameter comprises adjusting a ratio between the amount of the first polymer type and the second polymer type in the block copolymer. In an embodiment, adjusting the physical parameter comprises adding a further polymer type to or removing a polymer type from the block copolymer. In an embodiment, adjusting the physical parameter comprises adjusting the length of the first polymer type or the second polymer type of the block copolymer. In an embodiment, the adjusting comprises adjusting a design of a template to guide the self-assembly of the block copolymer feature. In an embodiment, adjusting the template comprises adjusting a shape of a recess portion of the template. In an embodiment, the adjusting comprises adjusting a repellence between the first polymer type and the second polymer type or between the second polymer type and a portion of a template to guide the self-assembly of the block copolymer feature. In an embodiment, the adjusting comprises using an uncertainty in position of the first domain of the block copolymer feature to design a pattern of features; and further comprising forming the pattern of features on a substrate according to the design using the block copolymer. In an embodiment, the first domain of the block copolymer feature is surrounded by the second domain of the block copolymer feature. In an embodiment, the first domain is cylindrical. In an embodiment, the block copolymer feature is cylindrical. In an embodiment, the block copolymer feature has a width of between 20 and 100 nanometers. In an embodiment, the first domain has a width of between 5 and 50 nanometers. In an embodiment, the first polymer type is polymethylmethacrylate and the second polymer type is polystyrene.

In an embodiment, there is provided a computer program comprising computer readable instructions configured to cause a computer to carry out a method as described herein. In an embodiment, there is provided a computer readable medium carrying a computer program as described herein. In an embodiment, there is provided a computer apparatus comprising: a memory storing processor readable instructions, and a processor arranged to read and execute instructions stored in the memory, wherein the processor readable instructions comprise instructions arranged to control the computer to carry out a method as described herein.

FIG. 9 shows a computer 60. The computer 60 may implement any of the methods described herein including implement a simulation of a BCP feature and/or calculate an uncertainty associated with the positioning of a polymer domain with the BCP feature using any of the methods described herein. The computer 60 comprises a CPU (central processing unit) 61 which is configured to read and execute instructions stored in a memory 62 which may take the form of a random access memory. The memory 62 stores instructions for execution by the CPU 61 and data used by those instructions. For example, in use, a digital representation of a BCP feature and/or associated parameters (e.g., the block copolymer types, the BCP feature design shape, etc.) may be stored in the memory 62, together with instructions suitable for causing the computer to carry out a method as described herein.

The computer 60 may further comprise storage in the form of a hard disc drive 63. The digital representation of the BCP feature and/or the associated parameters may be stored on the hard disc drive 63. The computer 60 may further comprise an I/O (input/output) interface 64 to which is connected one or more peripheral devices used in connection with the computer 60. For instance, a display 65 may be provided so as to display output from the computer 60. The display 65 may, for example, display a representation of the BCP feature. Additionally, the display 65 may display one or more images generated by processing of the simulated BCP feature such as a graph of FIGS. 6, 7, 8, 9, 10 and/or 13, or a design of a substrate such as shown in FIG. 2. One or more input devices may be connected to the interface 64. Such an input device may include a keyboard 66 and/or a mouse 67 which allows user interaction with the computer 60.

A network interface 68 may be provided to allow the computer 60 to be connected to an appropriate computer network so as to receive and/or transmit data from and to other computing devices. The CPU 61, memory 62, storage 63, I/O interface 64 and network interface 68, are connected together by a bus 69.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the appended claims.

The invention claimed is:

1. A method for a self-assemblable block copolymer feature, the block copolymer feature comprising a first domain comprising a first polymer type and a second domain comprising a second polymer type, the method comprising:
simulating at least part of a self-assembly process of the block copolymer feature by computer processing a model that provides an uncertainty or error in the position of the first domain within the block copolymer feature in relation to a provided length of the second polymer type; and
using the provided uncertainty or error, forming a patterning device for creating a template for use in the self-assembly process, forming a template for guiding self-assemblable block copolymer in the self-assembly process, creating a self-assemblable block copolymer for use in the self-assembly process, or forming a pattern of features on a substrate using the self-assembly process.

2. The method of claim 1, wherein the model provides the uncertainty or error in position using a proportionality to the square root of the length of the second polymer type.

3. The method of claim 1, further comprising, from the provided uncertainty or error in position, adjusting a parameter of the self-assembly process of the block copolymer feature; and providing electronic data, based on the adjusted parameter, to a device, for a fabrication process for forming the self-assemblable block copolymer feature.

4. The method of claim 3, wherein the adjusting comprises adjusting a physical parameter of the block copolymer.

5. The method of claim 4, wherein adjusting the physical parameter comprises adjusting a ratio between the amount of the first polymer type and the second polymer type in the block copolymer.

6. The method of claim 4, wherein adjusting the physical parameter comprises adding a further polymer type to or removing a polymer type from the block copolymer.

7. The method of claim 4, wherein adjusting the physical parameter comprises adjusting the length of the first polymer type or the second polymer type of the block copolymer.

8. The method of claim 3, wherein the adjusting comprises adjusting a design of a template to guide the self-assembly of the block copolymer of the block copolymer feature.

9. The method of claim 8, wherein adjusting the template comprises adjusting a shape of a recess portion of the template.

10. The method of claim 3, wherein the adjusting comprises adjusting a repellence between the first polymer type and the second polymer type or between the second polymer type and a portion of a template to guide the self-assembly of the block copolymer of the block copolymer feature.

11. The method of claim 3, wherein the adjusting comprises designing a pattern of features to account for the uncertainty or error in the position of the first domain within the block copolymer feature; and further comprising forming the pattern of features on a substrate according to the design using the self-assembly block copolymer.

12. The method of claim 1, wherein the length of the second polymer type is a number of beads of the second polymer type.

13. A method for a plurality of adjacent self-assemblable block copolymer features at respective portions of a template to guide the self-assembly of the block copolymer of the block copolymer features, the block copolymer features respectively comprising a first domain comprising a first polymer type and a second domain comprising a second polymer type, the method comprising:
    simulating at least part of a self-assembly process of the block copolymer features by computer processing a model that determines an uncertainty or error in the position of the first domain within one of the block copolymer features from an offset between a designed self-assembly location of one of the template portions and the position of the first domain within the self-assembled block copolymer feature at that designed self-assembly location; and
    using the provided uncertainty or error, forming a patterning device for creating a template for use in the self-assembly process, forming a template for guiding self-assemblable block copolymer in the self-assembly process, creating a self-assemblable block copolymer for use in the self-assembly process, or forming a pattern of features on a substrate using the self-assembly process.

14. The method of claim 13, wherein the model provides the uncertainty or error in position using a proportionality to the square root of the offset.

15. The method of claim 13, wherein the uncertainty or error in position is further determined from an uncertainty or error of the position of the first domain within the block copolymer feature at its respective portion of the template without the one or more other adjacent self-assemblable block copolymer features.

16. The method of claim 13, further comprising, from the provided uncertainty or error in position, adjusting a design of the template or adjusting a physical parameter of the block copolymer; and providing electronic data, based on the adjusted design or adjusted physical parameter, to a physical device, for a fabrication process for forming the self-assemblable block copolymer.

17. A method for a patterning process comprising self-assembly of a block copolymer feature, the block copolymer feature comprising a first domain comprising a first polymer type and a second domain comprising a second polymer type, the method comprising:
    simulating at least part of a self-assembly process of the block copolymer feature by computer processing a model that provides an uncertainty or error in the position of the first domain within the block copolymer feature in relation to a provided length of the second polymer type; and
    using the provided uncertainty or error, forming a patterning device for creating a template for use in the patterning device, forming a template for guiding self-assemblable block copolymer in the patterning process, creating a self-assemblable block copolymer for use in the patterning process, or forming a pattern of features on a substrate using the patterning process.

18. A non-transitory computer-readable medium having instructions therein, the instructions, upon execution by a computer system, configured to cause the computer system to at least:
    simulate at least part of a self-assembly process of a self-assemblable block copolymer feature, the block copolymer feature comprising a first domain comprising a first polymer type and a second domain comprising a second polymer type, by computer processing a model that provides an uncertainty or error in the position of the first domain within the block copolymer feature in relation to a provided length of the second polymer type; and
    effect, using the provided uncertainty or error, formation of a patterning device for creating a template for use in the self-assembly process, formation of a template for guiding self-assemblable block copolymer in the self-assembly process, creation of a self-assemblable block copolymer for use in the self-assembly process, or formation of a pattern of features on a substrate using the self-assembly process.

19. The computer-readable medium of claim 18, wherein the instructions are further configured to, from the provided uncertainty or error in position, adjust a parameter of the self-assembly process of the block copolymer feature, and provide electronic data, based on the adjusted parameter, to a device, for a fabrication process for forming the self-assemblable block copolymer feature.

20. A non-transitory computer-readable medium having instructions therein, the instructions, upon execution by a computer system, configured to cause the computer system to at least:

simulate at least part of a self-assembly process of a plurality of adjacent self-assemblable block copolymer features at respective portions of a template to guide the self-assembly of the block copolymer of the block copolymer features, the block copolymer features respectively comprising a first domain comprising a first polymer type and a second domain comprising a second polymer type, by computer processing a model that determines an uncertainty or error in the position of the first domain within one of the block copolymer features from an offset between a designed self-assembly location of one of the template portions and the position of the first domain within the self-assembled block copolymer feature at that designed self-assembly location; and effect, based on the provided uncertainty or error, formation of a patterning device for creating a template for use in the self-assembly process, formation of a template for guiding self-assemblable block copolymer in the self-assembly process, creation of a self-assemblable block copolymer for use in the self-assembly process, or formation of a pattern of features on a substrate using the self-assembly process.

* * * * *